United States Patent
Chew et al.

(10) Patent No.: US 11,206,025 B2
(45) Date of Patent: Dec. 21, 2021

(54) INPUT/OUTPUT BUS PROTECTION SYSTEMS AND METHODS FOR PROGRAMMABLE LOGIC DEVICES

(71) Applicant: Lattice Semiconductor Corporation, Hillsboro, OR (US)

(72) Inventors: Chwei-Po Chew, San Jose, CA (US); Brad Sharpe-Geisler, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 17/332,943

(22) Filed: May 27, 2021

(65) Prior Publication Data

US 2021/0288651 A1    Sep. 16, 2021

Related U.S. Application Data

(63) Continuation of application No. PCT/US2020/063847, filed on Dec. 8, 2020.
(Continued)

(51) Int. Cl.
*G06F 13/20* (2006.01)
*H03K 19/17764* (2020.01)
(Continued)

(52) U.S. Cl.
CPC ..... *H03K 19/17764* (2013.01); *G05B 19/054* (2013.01); *G05B 19/058* (2013.01);
(Continued)

(58) Field of Classification Search
CPC ..... G06F 13/20; G06F 1/3253; G05B 19/054; G05B 19/058; G05B 2219/1105; G05B 2219/1131
See application file for complete search history.

(56) References Cited

U.S. PATENT DOCUMENTS 6,163,166 A * 12/2000 Bielby ............. H03K 19/17744
326/38
7,571,413 B1 * 8/2009 Ghosh Dastidar .........................
G01R 31/318516
326/37
(Continued)

FOREIGN PATENT DOCUMENTS

WO   WO 1996/038915   12/1996
WO   WO 1999/034515   7/1999

*Primary Examiner* — Henry Tsai
*Assistant Examiner* — Christopher A Daley
(74) *Attorney, Agent, or Firm* — Haynes and Boone, LLP

(57) ABSTRACT

Systems and methods for providing external bus protection for programmable logic devices (PLDs) are disclosed. An example system includes a programmable I/O bus configured to interface with a user device over an external bus interface coupled to a PLD; a bus protection circuit arrangement integrated with the programmable I/O interface and configured to provide I/O bus supply voltage protection for the programmable I/O interface; and a bus protection control signal generator. The bus protection control signal generator generates a default bus protection control signal for the bus protection circuit arrangement of the PLD prior to completion of a power ramp performed by the user device; an intermediate bus protection control signal for the PLD prior to completion of loading a PLD configuration into a PLD fabric of the PLD; and an operational bus protection control signal for the PLD.

20 Claims, 23 Drawing Sheets

Related U.S. Application Data

(60) Provisional application No. 62/945,874, filed on Dec. 9, 2019.

(51) Int. Cl.
*G06F 1/3234* (2019.01)
*G05B 19/05* (2006.01)
*H03K 19/17736* (2020.01)

(52) U.S. Cl.
CPC ............ *G06F 1/3253* (2013.01); *G06F 13/20* (2013.01); *H03K 19/17744* (2013.01); *G05B 2219/1105* (2013.01); *G05B 2219/1131* (2013.01)

(56) References Cited

U.S. PATENT DOCUMENTS

| | | | |
|---|---|---|---|
| 8,208,339 B2 * | 6/2012 | Joshi | G11C 11/417 365/227 |
| 9,589,612 B1 * | 3/2017 | Rahman | G11C 29/12 |
| 2010/0121537 A1 * | 5/2010 | Tanaka | B60R 21/01 701/47 |
| 2011/0068823 A1 | 3/2011 | German et al. | |
| 2014/0233143 A1 * | 8/2014 | Ohtomo | H02H 7/261 361/93.6 |
| 2018/0026636 A1 | 1/2018 | Birkner et al. | |
| 2018/0069736 A1 | 3/2018 | Sharpe-Geisler | |
| 2020/0195004 A1 * | 6/2020 | Xiong | G01R 33/0094 |

* cited by examiner

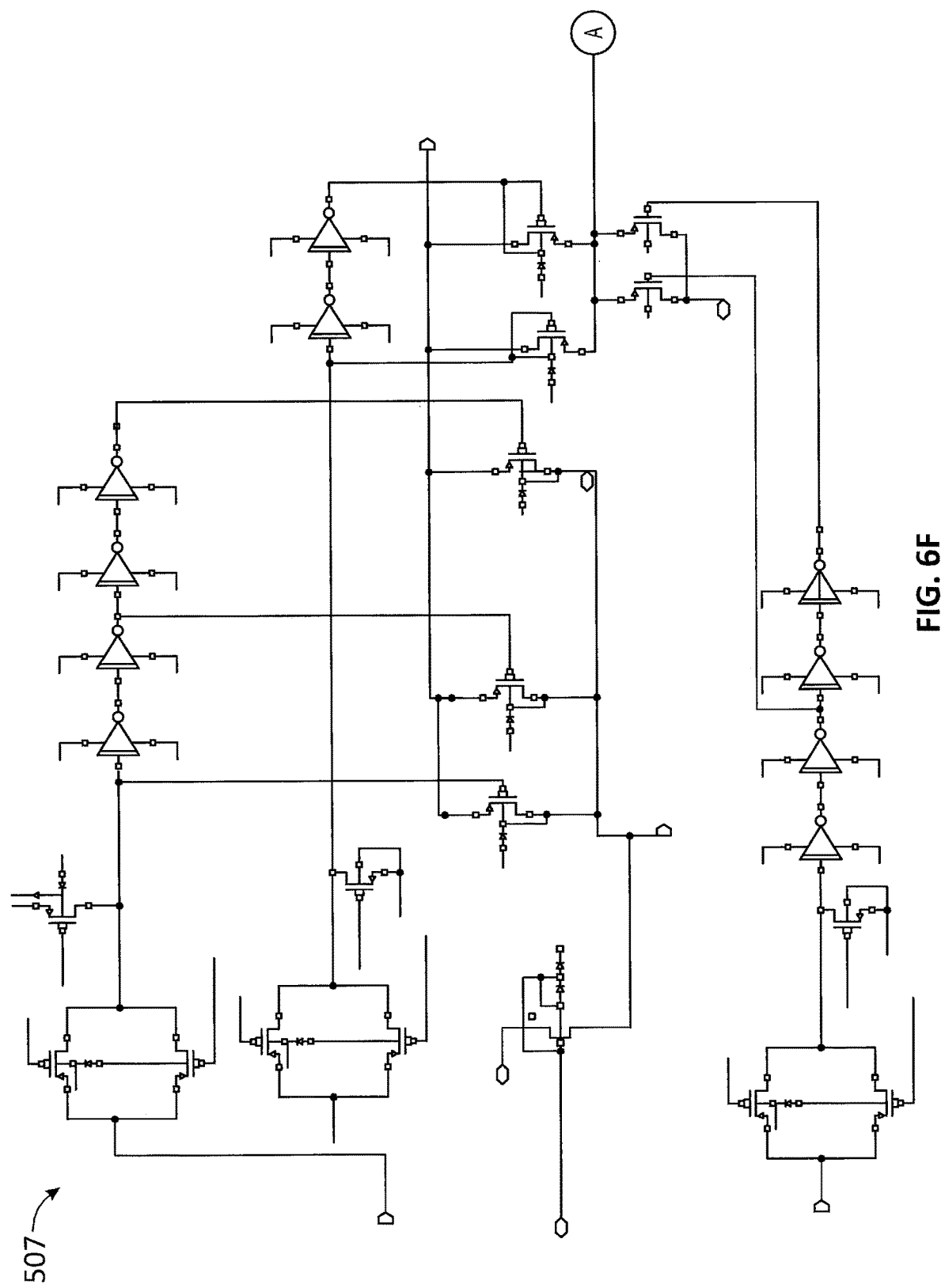

INPUT/OUTPUT BUS PROTECTION SYSTEMS AND METHODS FOR PROGRAMMABLE LOGIC DEVICES

CROSS-REFERENCE TO RELATED APPLICATIONS

This patent application is a continuation of International Patent Application No. PCT/US2020/063847 filed Dec. 8, 2020 and entitled "INPUT/OUTPUT BUS PROTECTION SYSTEMS AND METHODS FOR PROGRAMMABLE LOGIC DEVICES" which is incorporated herein by reference in its entirety.

International Patent Application No. PCT/US2020/063847 claims priority to and the benefit of U.S. Provisional Patent Application No. 62/945,874 filed Dec. 9, 2019 and entitled "INPUT/OUTPUT BUS PROTECTION SYSTEMS AND METHODS FOR PROGRAMMABLE LOGIC DEVICES," which is hereby incorporated by reference in its entirety.

TECHNICAL FIELD

The present invention relates generally to programmable logic devices and, more particularly, to input/output bus protection for such devices.

BACKGROUND

Programmable logic devices (PLDs) (e.g., field programmable gate arrays (FPGAs), complex programmable logic devices (CPLDs), field programmable systems on a chip (FPSCs), or other types of programmable devices) may be configured with various user designs to implement desired functionality. Typically, user designs are synthesized and mapped into configurable resources (e.g., programmable logic gates, look-up tables (LUTs), embedded hardware, or other types of resources) and interconnections available in particular PLDs. Physical placement and routing for the synthesized and mapped user designs may then be determined to generate configuration data for the particular PLDs.

PLDs may be used to control and/or be integrated with large array of different types of user devices, and the input/output (I/O) buses of such PLDs (e.g., general purpose I/O (GPIO) buses used to communicate with the user device and/or elements of the user device) can be subjected to a relatively wide range of different bus supply voltages (e.g., VCCIO, generally between 1.2v and 3.3v, +/−10%). Such bus supply voltages are typically stable during operation of the user device/PLD, but bus supply voltages can vary (e.g., ramp, or be set initially to one power on value and then ramp to an operational value) during a typical power on sequence for the user device and/or the PLD. Moreover, PLDs and/or other logic devices fabricated using advanced integrated circuit processes (e.g., 28 nm fully depleted silicon-on-insulator—FDSOI—processes) may be implemented with I/O transistors (e.g., relatively thick gate transistors) that can only tolerate up to approximately 1.8v+/−10% (e.g., source/drain Vds, gate/source Vgs, gate/drain Vgd voltages) and guarantee an operational lifespan of at least 10 years without incurring reliability issues. Thus, there is a need in the art for systems and methods to provide I/O bus supply voltage protections for PLDs, particularly during power on of a PLD and/or a user device controlled by and/or integrated with the PLD.

Figure 1:
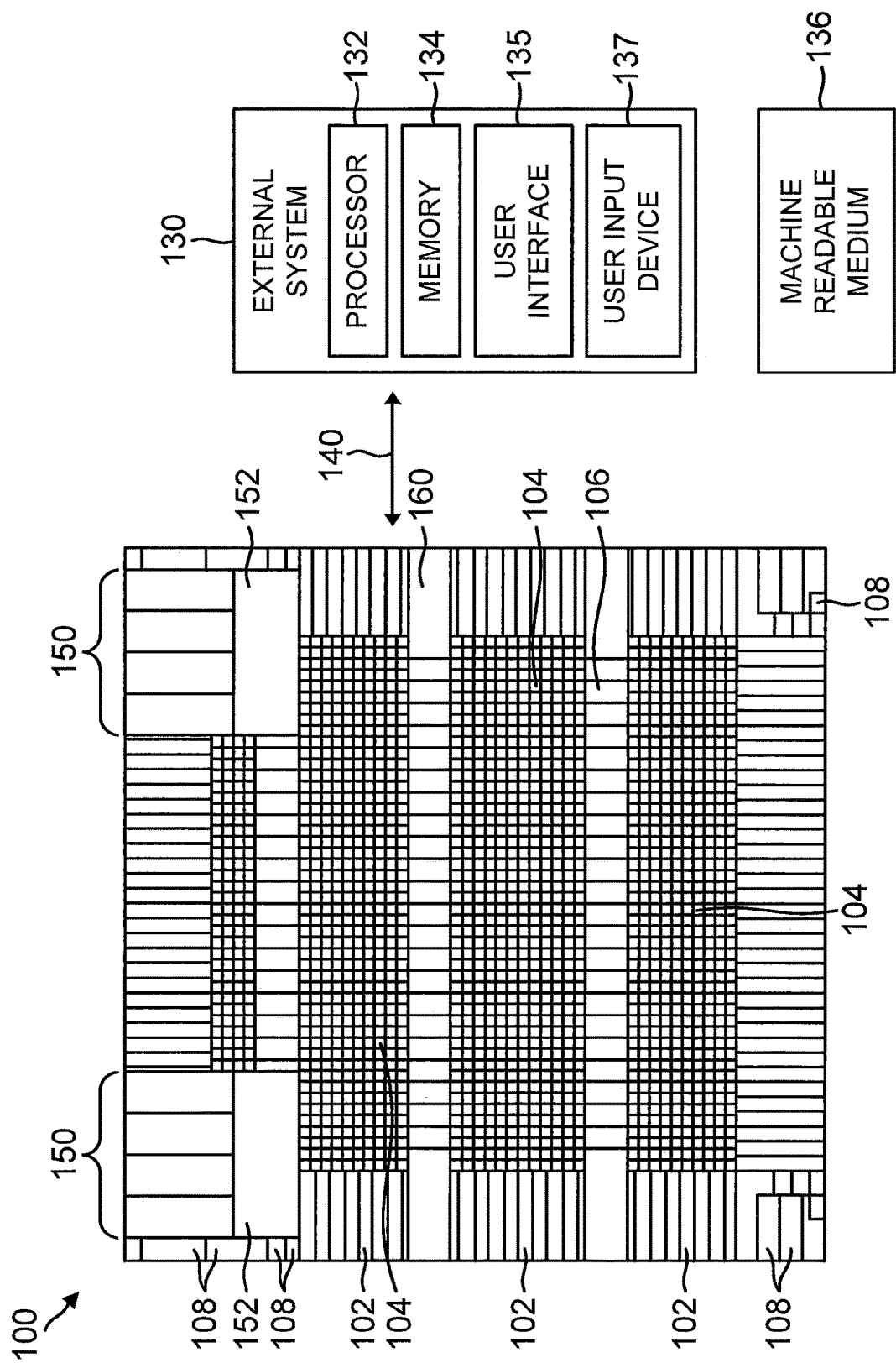
FIG. 1 illustrates a block diagram of a programmable logic device (PLD) in accordance with an embodiment of the disclosure.

Embodiments of the present disclosure and their advantages are best understood by referring to the detailed description that follows. It should be appreciated that like reference numerals are used to identify like elements illustrated in one or more of the figures, wherein showings therein are for purposes of illustrating embodiments of the present disclosure and not for purposes of limiting the same.

DETAILED DESCRIPTION

The present disclosure provides systems and methods for providing input/output (I/O) bus protection for a programmable logic device (PLD) for use in or with various user devices for computing applications and architectures, as described herein. In particular, embodiments include a bus protection control signal generator and a bus protection circuit arrangement configured to provide I/O bus supply voltage (e.g., VCCIO) protection for I/O buses of PLDs.

For example, PLDs can be integrated into and/or configured to control a wide array of different user devices, each with varying I/O bus supply voltage requirements, generally selected to be one or more of 1.2v, 1.5v, 1.8v, 2.5v, and 3.3v. To increase flexibility of a particular PLD, each I/O bus may be implemented with a bus protection control signal generator and a bus protection circuit arrangement configured to protect relatively sensitive I/O bus elements (e.g., I/O buffer/driver transistors) during all states of operation, including during power on states, where the various supply voltages provided to the PLD ramp to their operating levels. In general, the bus protection circuit arrangement may be implemented as a cascode transistor arrangement, as described herein, where protection transistors in the cascode transistor arrangement are biased by the bus protection control signal generator (e.g., via bias protection control signals) to ensure substantially all transistor voltages (e.g., source/drain Vds, gate/source Vgs, gate/drain Vgd) remain below an acceptable operational voltage drop specific to the transistors implementing the particular I/O bus (e.g., typically 1.8v+/−10%) during all operational modes/states of the I/O bus, the PLD, and/or a user device controlled by/integrated with/interfaced with the PLD. Moreover, embodiments described herein may be placed in a dormant or off mode that reduces or eliminates power leakage and/or associated dissipative heating while in certain operational modes, as described herein.

In accordance with embodiments set forth herein, techniques are provided to manage implementation of user designs in PLDs. In various embodiments, a user design may be converted into and/or represented by a set of PLD components (e.g., configured for logic, arithmetic, or other hardware functions) and their associated interconnections available in a PLD. For example, a PLD may include a number of programmable logic blocks (PLBs), each PLB including a number of logic cells, and configurable routing resources that may be used to interconnect the PLBs and/or logic cells. In some embodiments, each PLB may be implemented with between 2 and 16 or between 2 and 32 logic cells.

In general, a PLD (e.g., an FPGA) fabric includes one or more routing structures and an array of similarly arranged logic cells arranged within programmable function blocks (e.g., PFBs and/or PLBs). The purpose of the routing structures is to programmably connect the ports of the logic cells/PLBs to one another in such combinations as necessary to achieve an intended functionality. A remote PLD may include various additional "hard" engines or modules configured to provide a range of remote management functionality that may be linked to operation of the PLD fabric to provide configurable computing functionality and/or architectures. Routing flexibility and configurable function embedding may be used when synthesizing, mapping, placing, and/or routing a user design into a number of PLD components. As a result of various user design optimization processes, a user design can be implemented relatively efficiently, thereby freeing up configurable PLD components that would otherwise be occupied by additional operations and routing resources. In some embodiments, an optimized user design may be represented by a netlist that identifies various types of components provided by the PLD and their associated signals. In embodiments that produce a netlist of the converted user design, the optimization process may be performed on such a netlist. Once optimized, such configuration may be loaded into a PLD and the PLD may boot and execute the configuration, which may include the use of various I/O buses to communicate with a user device, as described herein.

Referring now to the drawings, FIG. 1 illustrates a block diagram of a PLD 100 in accordance with an embodiment of the disclosure. PLD 100 (e.g., a field programmable gate array (FPGA)), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)). More generally, the individual elements of PLD 100 may be referred to as a PLD fabric.

I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100. Additional I/O functionality may be provided by serializer/deserializer (SERDES) blocks 150 and physical coding sublayer (PCS) blocks 152. PLD 100 may also include hard intellectual property core (IP) blocks 160 to provide additional functionality (e.g., substantially predetermined functionality provided in hardware which may be configured with less programming than logic blocks 104).

PLD 100 may also include blocks of memory 106 (e.g., blocks of EEPROM, block SRAM, and/or flash memory), clock-related circuitry 108 (e.g., clock sources, PLL circuits, and/or DLL circuits), and/or various routing resources 180 (e.g., interconnect and appropriate switching logic to provide paths for routing signals throughout PLD 100, such as for clock signals, data signals, or others) as appropriate. In general, the various elements of PLD 100 may be used to perform their intended functions for desired applications, as would be understood by one skilled in the art.

For example, certain I/O blocks 102 may be used for programming memory 106 or transferring information (e.g., various types of user data and/or control signals) to/from PLD 100. Other I/O blocks 102 include a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). In various embodiments, I/O blocks 102 may be included to receive configuration data and commands (e.g., over one or more connections 140) to configure PLD 100 for its intended use and to support serial or parallel device configuration and information transfer with SERDES blocks 150, PCS blocks 152, hard IP blocks 160, and/or logic blocks 104 as appropriate.

It should be understood that the number and placement of the various elements are not limiting and may depend upon the desired application. For example, various elements may not be required for a desired application or design specification (e.g., for the type of programmable device selected). Furthermore, it should be understood that the elements are illustrated in block form for clarity and that various elements would typically be distributed throughout PLD 100, such as in and between logic blocks 104, hard IP blocks 160, and routing resources (e.g., routing resources 180 of FIG. 2) to perform their conventional functions (e.g., storing configuration data that configures PLD 100 or providing interconnect structure within PLD 100). It should also be understood that the various embodiments disclosed herein are not limited to programmable logic devices, such as PLD 100, and may be applied to various other types of programmable devices, as would be understood by one skilled in the art.

An external system 130 may be used to create a desired user configuration or design of PLD 100 and generate corresponding configuration data to program (e.g., configure) PLD 100. For example, system 130 may provide such configuration data to one or more I/O blocks 102, SERDES blocks 150, and/or other portions of PLD 100. As a result, programmable logic blocks 104, various routing resources, and any other appropriate components of PLD 100 may be configured to operate in accordance with user-specified applications.

In the illustrated embodiment, system 130 is implemented as a computer system. In this regard, system 130 includes, for example, one or more processors 132 which may be configured to execute instructions, such as software instructions, provided in one or more memories 134 and/or stored in non-transitory form in one or more non-transitory machine readable mediums 136 (e.g., which may be internal or external to system 130). For example, in some embodiments, system 130 may run PLD configuration software, such as Lattice Diamond System Planner software available from Lattice Semiconductor Corporation to permit a user to create a desired configuration and generate corresponding configuration data to program PLD 100.

System 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of PLD 100.

Figure 2:
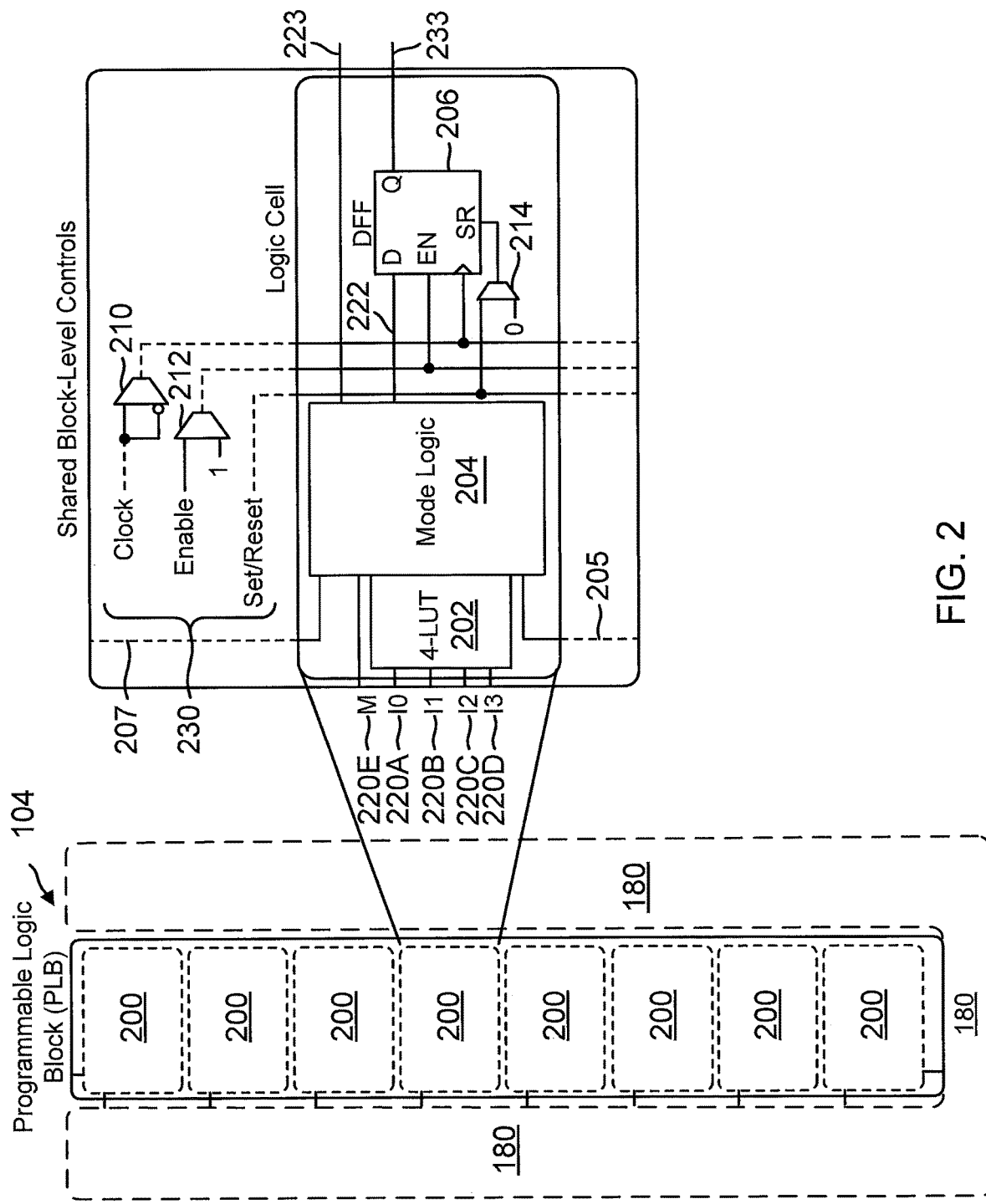
FIG. 2 illustrates a block diagram of a logic block for a PLD in accordance with an embodiment of the disclosure.

FIG. 2 illustrates a block diagram of a logic block 104 of PLD 100 in accordance with an embodiment of the disclosure. As discussed, PLD 100 includes a plurality of logic blocks 104 including various components to provide logic and arithmetic functionality. In the example embodiment shown in FIG. 2, logic block 104 includes a plurality of logic cells 200, which may be interconnected internally within logic block 104 and/or externally using routing resources 180. For example, each logic cell 200 may include various components such as: a lookup table (LUT) 202, a mode logic circuit 204, a register 206 (e.g., a flip-flop or latch), and various programmable multiplexers (e.g., programmable multiplexers 212 and 214) for selecting desired signal paths for logic cell 200 and/or between logic cells 200. In this example, LUT 202 accepts four inputs 220A-220D, which makes it a four-input LUT (which may be abbreviated as "4-LUT" or "LUT4") that can be programmed by configuration data for PLD 100 to implement any appropriate logic operation having four inputs or less. Mode Logic 204 may include various logic elements and/or additional inputs, such as input 220E, to support the functionality of various modes, as described herein. LUT 202 in other examples may be of any other suitable size having any other suitable number of inputs for a particular implementation of a PLD. In some embodiments, different size LUTs may be provided for different logic blocks 104 and/or different logic cells 200.

An output signal 222 from LUT 202 and/or mode logic 204 may in some embodiments be passed through register 206 to provide an output signal 233 of logic cell 200. In various embodiments, an output signal 223 from LUT 202 and/or mode logic 204 may be passed to output 223 directly, as shown. Depending on the configuration of multiplexers 210-214 and/or mode logic 204, output signal 222 may be temporarily stored (e.g., latched) in latch 206 according to control signals 230. In some embodiments, configuration data for PLD 100 may configure output 223 and/or 233 of logic cell 200 to be provided as one or more inputs of another logic cell 200 (e.g., in another logic block or the same logic block) in a staged or cascaded arrangement (e.g., comprising multiple levels) to configure logic operations that cannot be implemented in a single logic cell 200 (e.g., logic operations that have too many inputs to be implemented by a single LUT 202). Moreover, logic cells 200 may be implemented with multiple outputs and/or interconnections to facilitate selectable modes of operation, as described herein.

Mode logic circuit 204 may be utilized for some configurations of PLD 100 to efficiently implement arithmetic operations such as adders, subtractors, comparators, counters, or other operations, to efficiently form some extended logic operations (e.g., higher order LUTs, working on multiple bit data), to efficiently implement a relatively small RAM, and/or to allow for selection between logic, arithmetic, extended logic, and/or other selectable modes of operation. In this regard, mode logic circuits 204 across multiple logic cells 202, may be chained together to pass carry-in signals 205 and carry-out signals 207, and/or other signals (e.g., output signals 222) between adjacent logic cells 202, as described herein. In the example of FIG. 2, carry-in signal 205 may be passed directly to mode logic circuit 204, for example, or may be passed to mode logic circuit 204 by configuring one or more programmable multiplexers, as described herein. In some embodiments, mode logic circuits 204 may be chained across multiple logic blocks 104.

Logic cell 200 illustrated in FIG. 2 is merely an example, and logic cells 200 according to different embodiments may include different combinations and arrangements of PLD components. Also, although FIG. 2 illustrates logic block 104 having eight logic cells 200, logic block 104 according to other embodiments may include fewer logic cells 200 or more logic cells 200. Each of the logic cells 200 of logic block 104 may be used to implement a portion of a user design implemented by PLD 100. In this regard, PLD 100 may include many logic blocks 104, each of which may include logic cells 200 and/or other components which are used to collectively implement the user design.

As further described herein, portions of a user design may be adjusted to occupy fewer logic cells 200, fewer logic blocks 104, and/or with less burden on routing resources 180 when PLD 100 is configured to implement the user design. Such adjustments according to various embodiments may identify certain logic, arithmetic, and/or extended logic operations, to be implemented in an arrangement occupying multiple embodiments of logic cells 200 and/or logic blocks 104. As further described herein, an optimization process may route various signal connections associated with the arithmetic/logic operations described herein, such that a logic, ripple arithmetic, or extended logic operation may be implemented into one or more logic cells 200 and/or logic blocks 104 to be associated with the preceding arithmetic/logic operations.

Figure 3:
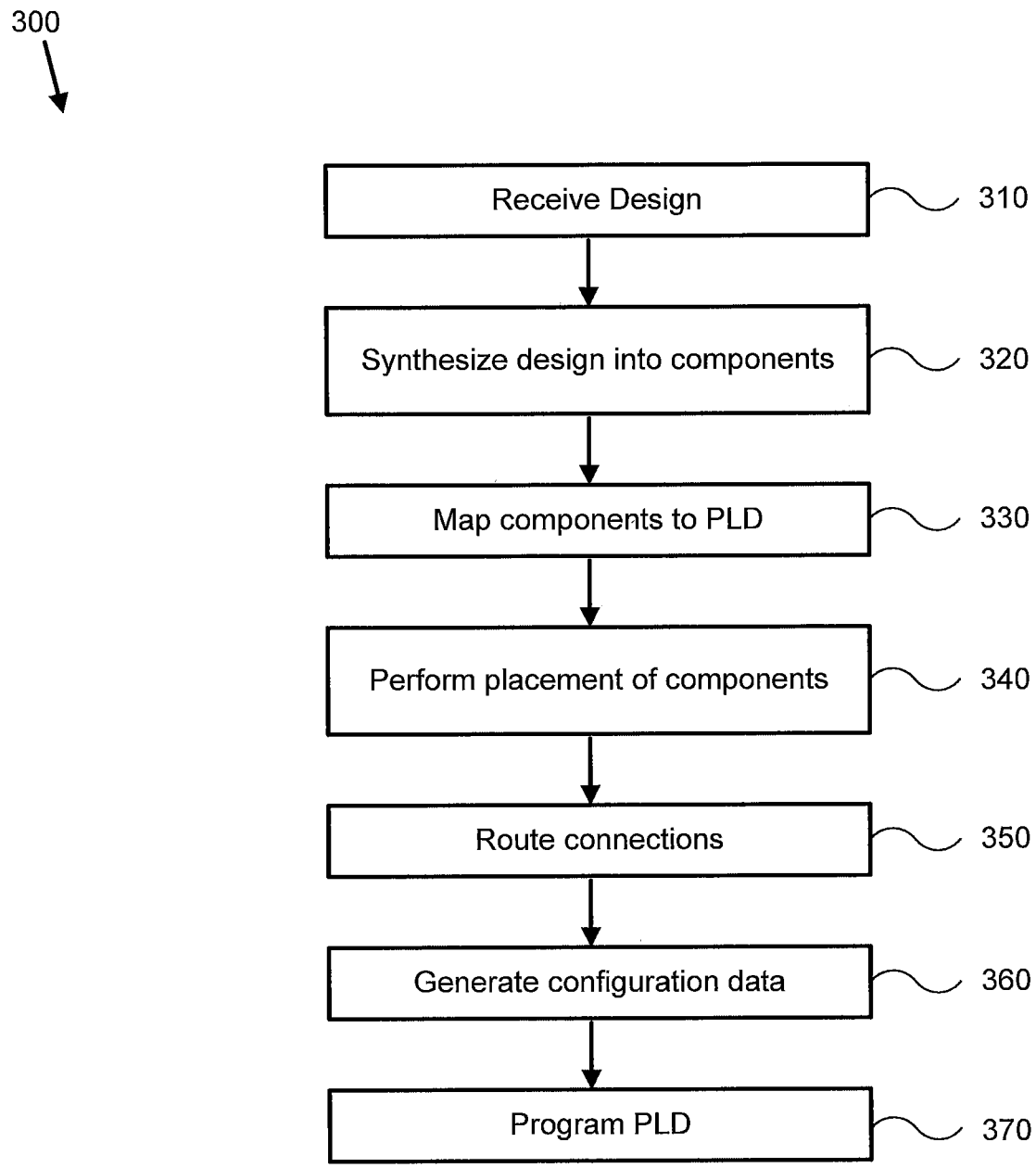
FIG. 3 illustrates a design process for a PLD in accordance with an embodiment of the disclosure.

FIG. 3 illustrates a design process 300 for a PLD in accordance with an embodiment of the disclosure. For example, the process of FIG. 3 may be performed by system 130 running Lattice Diamond software to configure PLD 100. In some embodiments, the various files and information referenced in FIG. 3 may be stored, for example, in one or more databases and/or other data structures in memory 134, machine readable medium 136, and/or otherwise. In various embodiments, such files and/or information may be encrypted or otherwise secured when stored and/or conveyed to PLD 100 and/or other devices or systems.

In operation 310, system 130 receives a user design that specifies the desired functionality of PLD 100. For example, the user may interact with system 130 (e.g., through user input device 137 and hardware description language (HDL) code representing the design) to identify various features of the user design (e.g., high level logic operations, hardware configurations, and/or other features). In some embodiments, the user design may be provided in a register transfer level (RTL) description (e.g., a gate level description). System 130 may perform one or more rule checks to confirm that the user design describes a valid configuration of PLD 100. For example, system 130 may reject invalid configurations and/or request the user to provide new design information as appropriate.

In operation 320, system 130 synthesizes the design to create a netlist (e.g., a synthesized RTL description) identifying an abstract logic implementation of the user design as a plurality of logic components (e.g., also referred to as netlist components), which may include both programmable components and hard IP components of PLD 100. In some embodiments, the netlist may be stored in Electronic Design Interchange Format (EDIF) in a Native Generic Database (NGD) file.

In some embodiments, synthesizing the design into a netlist in operation 320 may involve converting (e.g., translating) the high-level description of logic operations, hardware configurations, and/or other features in the user design into a set of PLD components (e.g., logic blocks 104, logic cells 200, and other components of PLD 100 configured for logic, arithmetic, or other hardware functions to implement the user design) and their associated interconnections or signals. Depending on embodiments, the converted user design may be represented as a netlist.

In some embodiments, synthesizing the design into a netlist in operation 320 may further involve performing an optimization process on the user design (e.g., the user design converted/translated into a set of PLD components and their associated interconnections or signals) to reduce propagation delays, consumption of PLD resources and routing resources, and/or otherwise optimize the performance of the PLD when configured to implement the user design. Depending on embodiments, the optimization process may be performed on a netlist representing the converted/translated user design. Depending on embodiments, the optimization process may represent the optimized user design in a netlist (e.g., to produce an optimized netlist).

In some embodiments, the optimization process may include optimizing certain instances of a logic function operation, a ripple arithmetic operation, and/or an extended logic function operation which, when a PLD is configured to implement the user design, would occupy a plurality of configurable PLD components (e.g., logic cells 200, logic blocks 104, and/or routing resources 180). For example, the optimization process may include detecting multiple mode or configurable logic cells implementing logic function operations, ripple arithmetic operations, extended logic function operations, and/or corresponding routing resources in the user design, interchanging operational modes of logic cells implementing the various operations to reduce the number of PLD components and/or routing resources used to implement the operations and/or to reduce the propagation delay associated with the operations, and/or reprogramming corresponding LUTs and/or mode logic to account for the interchanged operational modes.

In another example, the optimization process may include detecting extended logic function operations and/or corresponding routing resources in the user design, implementing the extended logic operations into multiple mode or convertible logic cells with single physical logic cell outputs, routing or coupling the logic cell outputs of a first set of logic cells to the inputs of a second set of logic cells to reduce the number of PLD components used to implement the extended logic operations and/or routing resources and/or to reduce the propagation delay associated with the extended logic operations, and/or programming corresponding LUTs and/or mode logic to implement the extended logic function operations with at least the first and second sets of logic cells.

In another example, the optimization process may include detecting multiple mode or configurable logic cells implementing logic function operations, ripple arithmetic operations, extended logic function operations, and/or corresponding routing resources in the user design, interchanging operational modes of logic cells implementing the various operations to provide a programmable register along a signal path within the PLD to reduce propagation delay associated with the signal path, and reprogramming corresponding LUTs, mode logic, and/or other logic cell control bits/registers to account for the interchanged operational modes and/or to program the programmable register to store or latch a signal on the signal path.

In operation 330, system 130 performs a mapping process that identifies components of PLD 100 that may be used to implement the user design. In this regard, system 130 may map the optimized netlist (e.g., stored in operation 320 as a result of the optimization process) to various types of components provided by PLD 100 (e.g., logic blocks 104, logic cells 200, embedded hardware, and/or other portions of PLD 100) and their associated signals (e.g., in a logical fashion, but without yet specifying placement or routing). In some embodiments, the mapping may be performed on one or more previously-stored NGD files, with the mapping results stored as a physical design file (e.g., also referred to as an NCD file). In some embodiments, the mapping process may be performed as part of the synthesis process in operation 320 to produce a netlist that is mapped to PLD components.

In operation 340, system 130 performs a placement process to assign the mapped netlist components to particular physical components residing at specific physical locations of the PLD 100 (e.g., assigned to particular logic cells 200, logic blocks 104, routing resources 180, and/or other physical components of PLD 100), and thus determine a layout for the PLD 100. In some embodiments, the placement may be performed on one or more previously-stored NCD files, with the placement results stored as another physical design file.

In operation 350, system 130 performs a routing process to route connections (e.g., using routing resources 180) among the components of PLD 100 based on the placement layout determined in operation 340 to realize the physical interconnections among the placed components. In some embodiments, the routing may be performed on one or more previously-stored NCD files, with the routing results stored as another physical design file.

In various embodiments, routing the connections in operation 350 may further involve performing an optimization process on the user design to reduce propagation delays, consumption of PLD resources and/or routing resources, and/or otherwise optimize the performance of the PLD when configured to implement the user design. The optimization process may in some embodiments be performed on a physical design file representing the converted/translated user design, and the optimization process may represent the optimized user design in the physical design file (e.g., to produce an optimized physical design file).

In some embodiments, the optimization process may include optimizing certain instances of a logic function operation, a ripple arithmetic operation, and/or an extended logic function operation which, when a PLD is configured to implement the user design, would occupy a plurality of configurable PLD components (e.g., logic cells 200, logic blocks 104, and/or routing resources 180). For example, the optimization process may include detecting multiple mode or configurable logic cells implementing logic function operations, ripple arithmetic operations, extended logic function operations, and/or corresponding routing resources in the user design, interchanging operational modes of logic cells implementing the various operations to reduce the number of PLD components and/or routing resources used to implement the operations and/or to reduce the propagation delay associated with the operations, and/or reprogramming corresponding LUTs and/or mode logic to account for the interchanged operational modes.

In another example, the optimization process may include detecting extended logic function operations and/or corresponding routing resources in the user design, implementing the extended logic operations into multiple mode or convertible logic cells with single physical logic cell outputs, routing or coupling the logic cell outputs of a first set of logic cells to the inputs of a second set of logic cells to reduce the number of PLD components used to implement the extended logic operations and/or routing resources and/or to reduce the propagation delay associated with the extended logic operations, and/or programming corresponding LUTs and/or mode logic to implement the extended logic function operations with at least the first and second sets of logic cells.

In another example, the optimization process may include detecting multiple mode or configurable logic cells implementing logic function operations, ripple arithmetic operations, extended logic function operations, and/or corresponding routing resources in the user design, interchanging operational modes of logic cells implementing the various operations to provide a programmable register along a signal path within the PLD to reduce propagation delay associated with the signal path, and reprogramming corresponding LUTs, mode logic, and/or other logic cell control bits/registers to account for the interchanged operational modes and/or to program the programmable register to store or latch a signal on the signal path.

Changes in the routing may be propagated back to prior operations, such as synthesis, mapping, and/or placement, to further optimize various aspects of the user design.

Thus, following operation 350, one or more physical design files may be provided which specify the user design after it has been synthesized (e.g., converted and optimized), mapped, placed, and routed (e.g., further optimized) for PLD 100 (e.g., by combining the results of the corresponding previous operations). In operation 360, system 130 generates configuration data for the synthesized, mapped, placed, and routed user design. In various embodiments, such configuration data may be encrypted, signed, and/or otherwise protected as part of such generation process, as described more fully herein. In operation 370, system 130 configures PLD 100 with the configuration data by, for example, loading a configuration data bitstream (e.g., a "configuration" or "configuration image") into PLD 100 over connection 140. Such configuration may be provided in an encrypted, signed, or unsecured/unauthenticated form, for example, and PLD 100 may be configured to treat secured and unsecured configurations differently, as described herein.

Figure 4:
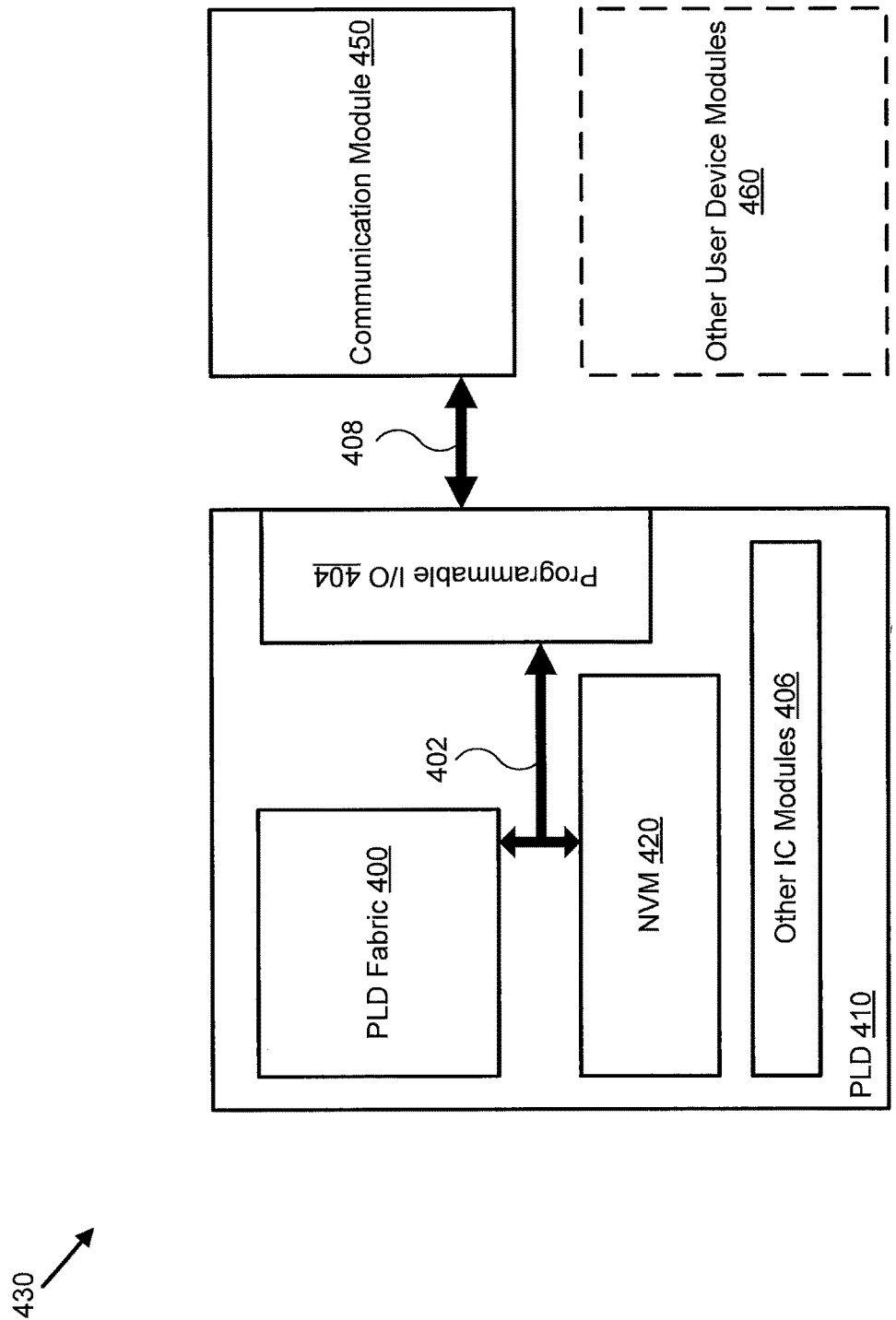
FIG. 4 illustrates a block diagram of a user device including a PLD in accordance with an embodiment of the disclosure.

FIG. 4 illustrates a block diagram of a user device 430 including a PLD 410 in accordance with an embodiment of the disclosure. In various embodiments, PLD 410 may be implemented by elements similar to those described with respect to PLD 100 in FIG. 1, but with additional configurable and/or hard IP elements configured to facilitate operation of PLD 410 in a particular computing application and/or architecture, as described herein. In particular, PLD 410 may include a PLD fabric 400 linked by various buses to a non-volatile memory (NVM) 420, a programmable I/O 404, and/or other integrated circuit (IC) modules 406, all implemented on a monolithic IC, as shown. In general, PLD fabric 400 may be implemented by any of the various elements described with respect to PLD 100 and may be configured using a design process similar to design process 300 described in relation to FIG. 3 to generate and program PLD fabric 400 according to a desired configuration. User device 430 may include communication module 450 and/or other user device modules 460 configured to facilitate remote management of PLD 410, for example, or to facilitate a particular user device application, as described herein. In various embodiments, user device 430 may be implemented as a smart phone, a laptop computer, a tablet computer, a desktop computer, a smart environmental sensor, a home automation device (e.g., sensor and/or actuator), an embedded device, a network management device, and/or other user device, as described herein.

NVM 420 may be implemented as a hard IP resource configured to provide securable and/or non-volatile storage of data used to facilitate operation of PLD 410. NVM 420 may include multiple differentiated sectors, such as one or more configuration image sectors, a device key sector (e.g., an AES key sector and a separate public key/key pair sector), a user flash memory (UFM) sector, and/or other defined storage sectors. Configuration image sectors may each store a configuration for PLD fabric 400, for example, so as to allow them to be selected (e.g., based on version or date) and used to program PLD fabric 400. A trim sector may be used to store manufacturer trim, device identifier, device category identifier, and/or other data specific to a particular PLD 410, for example, such as a modifiable customer-specific ordering part number and/or a generated customer ID number. Device key sectors may be used to store encryption/decryption keys, public/private keys, and/or other security keys specific to a particular PLD 410. UFM sectors may be used to store user data generally accessible by PLD fabric 400, such as configurations or application-specific security keys, certificates, and/or other secure(d) user data. Any one or more individual elements, portions, or sectors of NVM 420 may be implemented as configurable memory, for example, or one-time programmable (OTP) memory, as described herein.

Programmable I/O 404 may be implemented as at least partially configurable resources and/or hard IP resources configured to provide or support a communications link between PLD fabric 400 and an external controller, memory, and/or other device, such as communication module 450, for example, across bus 402 (e.g., a bus configured to link portions of PLD fabric 400 to programmable I/O 404 and/or NVM 420) and according to one or more external bus interfaces, protocols, and/or bus supply voltages (e.g., external bus interface 408). Programmable I/O 404 may also be configured to support communications between PLD fabric 400 and/or NVM 420 across bus 402 and/or external bus interface 408 with communication module 450, for example, in addition or as an alternative to external system 130/machine readable medium 136, as described herein.

In some embodiments, bus 402 and/or programmable I/O 404 may be integrated with PLD fabric 400. More generally, one or more elements of PLD 410 shown as separate in FIG. 4 may be integrated with and/or within each other. Other IC modules 406 may be implemented as hard and/or configurable IP resources configured to facilitate operation of PLD 410. For example, other IC modules 406 may include a security engine implemented as a hard IP resource configured to provide various security functions for use by PLD fabric 400 and/or user device 430, a configuration engine implemented as a hard IP resource configured to manage the configurations of and/or communications amongst the various elements of PLD 410, including to manage or control configurations of elements of PLD 410, boot of PLD fabric 400, and flow control throughout PLD 410, or may include one or more additional external access busses implemented according to one or more of a JTAG, I2C, SPI, and/or other external access bus or protocol, for example, configured to provide access to and/or from communication module 450 and/or other user device modules 460.

Communication module 450 may be implemented as a network communications IC configured to form communications links to a remote external device used to manage operation of PLD 410. For example, in some embodiments, communication module 450 may be implemented as a wireless communication module configured to support a wired and/or wireless communications link (e.g., formed according to WiFi, Bluetooth, Zigbee, Zwave, near-field communication (NFC), cellular, Ethernet, and/or other open and/or proprietary wired and/or wireless communication protocols) to a communications network, as described herein. In such embodiments, communication module 450 may be configured to manage various security features of such wired and/or wireless communications link (e.g., establishing communications link credentials, employing communications link credentials to establish a communications link, negotiating encryption keys for encrypted communications tunnels established over such communications link, such as transport layer security (TLS)), for example, and/or may be configured to be controlled by PLD 410 and/or other user device module 460 to manage such security features.

Other user device modules 460 may include various computing, sensor, and/or actuator elements configured to implement a particular user device application, for example, such as a remote sensor application, a remote controller application, and/or a remote computing application, as described herein. Other user device modules 460 may also include various other communication buses, power storage and delivery elements, user interfaces (e.g., buttons, keyboard, mouse, track pad, and/or displays/touch screen displays) to support such user device applications. In one embodiment, other user device modules 460 includes an electrical characteristic sensor configured to detect and/or measure an electrical state of transducer element (e.g., also an element of other user device modules 460) that is used to measure an environmental condition associated with user device 430. In another embodiment, other user device modules 460 includes various electronic devices typically found within a smart phone, a laptop computer, a tablet computer, and/or a desktop computer.

Figure 5A:
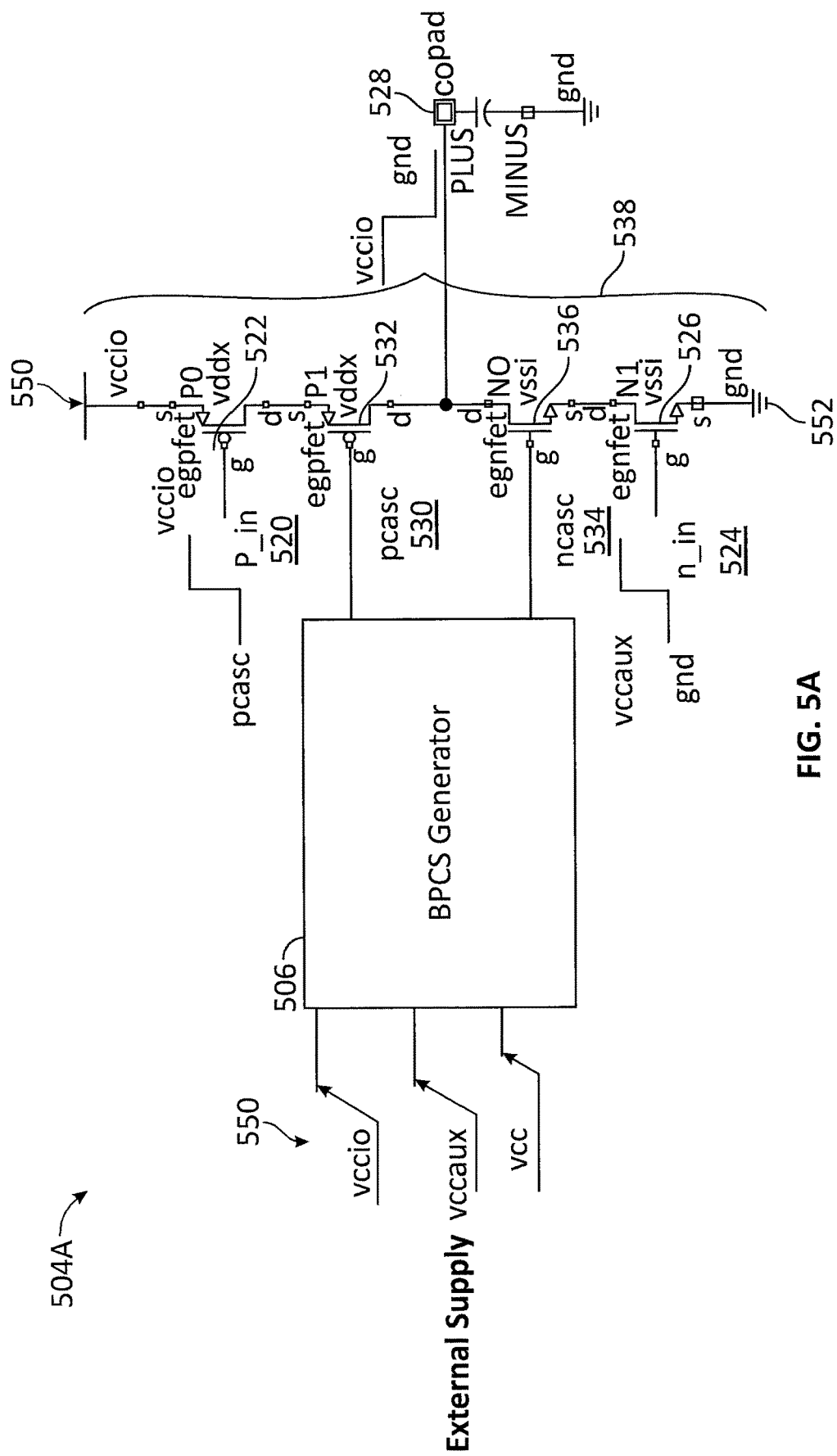
FIGS. 5A-D illustrate block diagrams of various input/output (I/O) buses for PLDs including bus protection control signal generators configured to provide I/O bus supply voltage protection for I/O buses of the PLDs in accordance with embodiments of the disclosure.

As described herein, embodiments of programmable I/O 404 may include a bus protection control signal generator and a bus protection circuit arrangement configured to provide I/O bus supply voltage (e.g., VCCIO) protection for programmable I/O 404 of PLD 410. FIGS. 5A-D illustrate block diagrams of various programmable I/O interfaces 504 (e.g., for PLD 410) including a bus protection control signal (BPCS) generator 506 configured to provide I/O bus supply voltage protection in accordance with embodiments of the disclosure. For example, FIG. 5A illustrates a block diagram of a programmable I/O interface 504A including bus protection control signal generator 506 configured to receive various external supply signals 550 (e.g., core voltage VCC, VCCAUX, I/O bus supply voltage VCCIO) and generate bus protection control signals pcasc 530 and ncasc 534 (e.g., transistor bias signals) for respective PMOS protection transistor 532 and NMOS protection transistor 536 of bus protection circuit arrangement 538 (e.g., a cascode transistor arrangement). Bus protection circuit arrangement 538 FIG. 5A is shown implemented as a single output driver for data signaling output pad 528 (e.g., referenced to system/local/bus ground 552); more generally, bus protection control signals pcasc 530 and ncasc 534 may be provided to an array of bus protection circuit arrangements 538. Also shown in programmable I/O interface 504a are PMOS signaling transistor 522 driven by data signaling input 520 and NMOS signaling transistor 526 driven by data signaling input 524, which are generally provided by PLD fabric 400 and/or other elements of PLD 410.

Figure 5B:
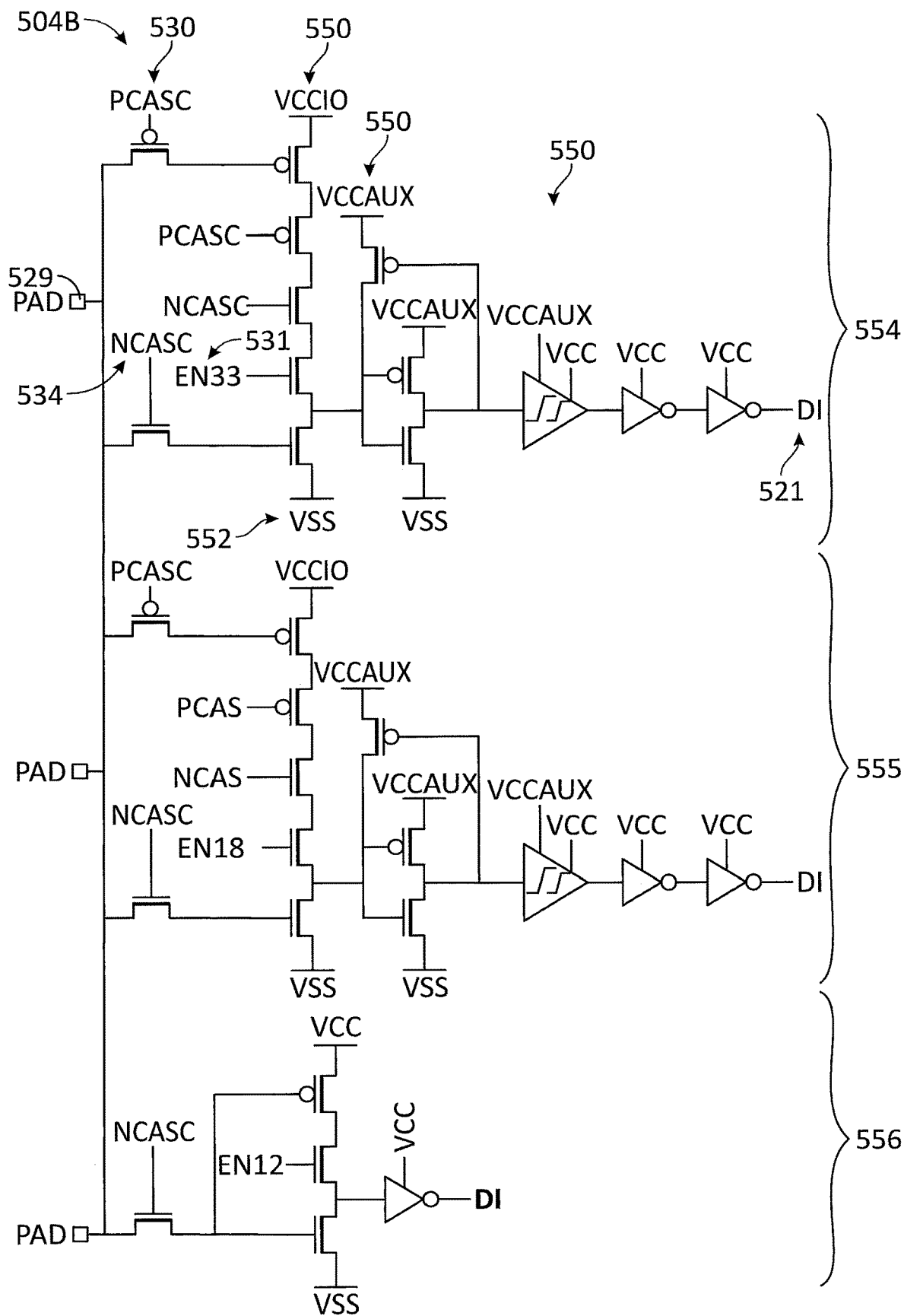

FIG. 5B illustrates a block diagram of a programmable I/O interface 504B including various bus protection circuit arrangements 554-556 configured to receive bus protection control signals pcasc 530 and ncasc 534 (e.g., from bus protection control signal generator 506), various external supply signals 550, and/or other control signals and provide I/O bus supply voltage protection for programmable I/O 404 of PLD 410. In particular, programmable I/O interface 504B may correspond to a single input buffer for data signaling input pads 529 (e.g., referenced to system/local/bus ground 552); more generally, bus protection control signals pcasc 530 and ncasc 534 may be provided to an array of bus protection circuit arrangements 554-556. As shown in FIG. 5B, bus protection circuit arrangements 554-556 may be implemented with enable inputs 531 (e.g., for 3.3, 1.8, and 1.2v) coupled to corresponding enable transistors 531 disposed within such cascode transistor arrangements (e.g., or serial array of transistor elements within each circuit arrangement) configured to cover an expected possible range of bus voltages and enable/disable and protect the cascode transistor arrangements within each bus protection circuit arrangements 554-556, as shown and described more fully herein. In various embodiments, such enable signals may be generated by PLD fabric 400 of PLD 410. Moreover, such enable inputs/transistors 531 may be configured to reduce and/or eliminate power draw of such circuit arrangements when not in use (e.g., when the corresponding I/O bus is not in use, or the corresponding bus voltage is not in use). Also shown in bus protection circuit arrangements 554-556 are data signaling outputs/DIs 521 of programmable I/O interface 504B.

Figure 5C:
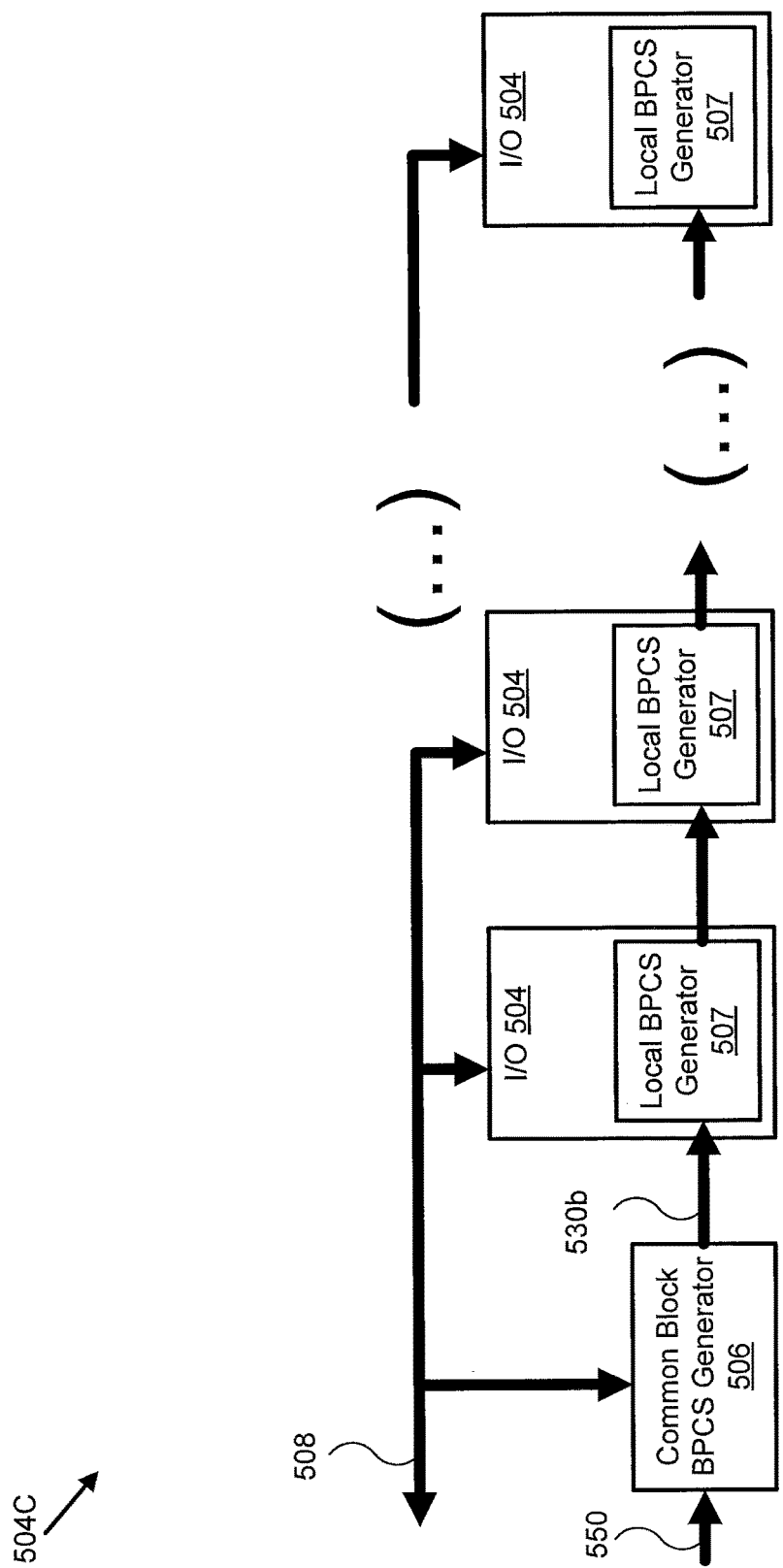

FIG. 5C illustrates a block diagram of a programmable I/O interface 504C including a common block BPCS generator 506 coupled through an array of local BPCS generators 507 each configured to apply bus protection control signals generated by common block BPCS generator 506 to their respective I/O buses 504, each of which may be coupled to user device 430 via one or more external buses 508, which may be physically separate and/or integrated buses, as shown. In generally, common block BPCS generator 506 may include circuit elements to receive external supply signals 550 and/or other relevant control signals, to generate bus protection control signals pcasc 530 and ncasc 534 based, at least in part, on such supply and/or control signals, and to provide bus protection control signals pcasc 530 and ncasc 534, along with other appropriate controls signals described herein, along bus protection control signal bus 530b. Local BPCS generators 507 may include only those circuit elements necessary to apply the received bus protection control signals to bus protection circuit arrangements within each I/O bus 504. In such embodiments, bus protection may be provided compactly and with less power across an array of I/O buses 504 of PLD 410.

Figure 5D:
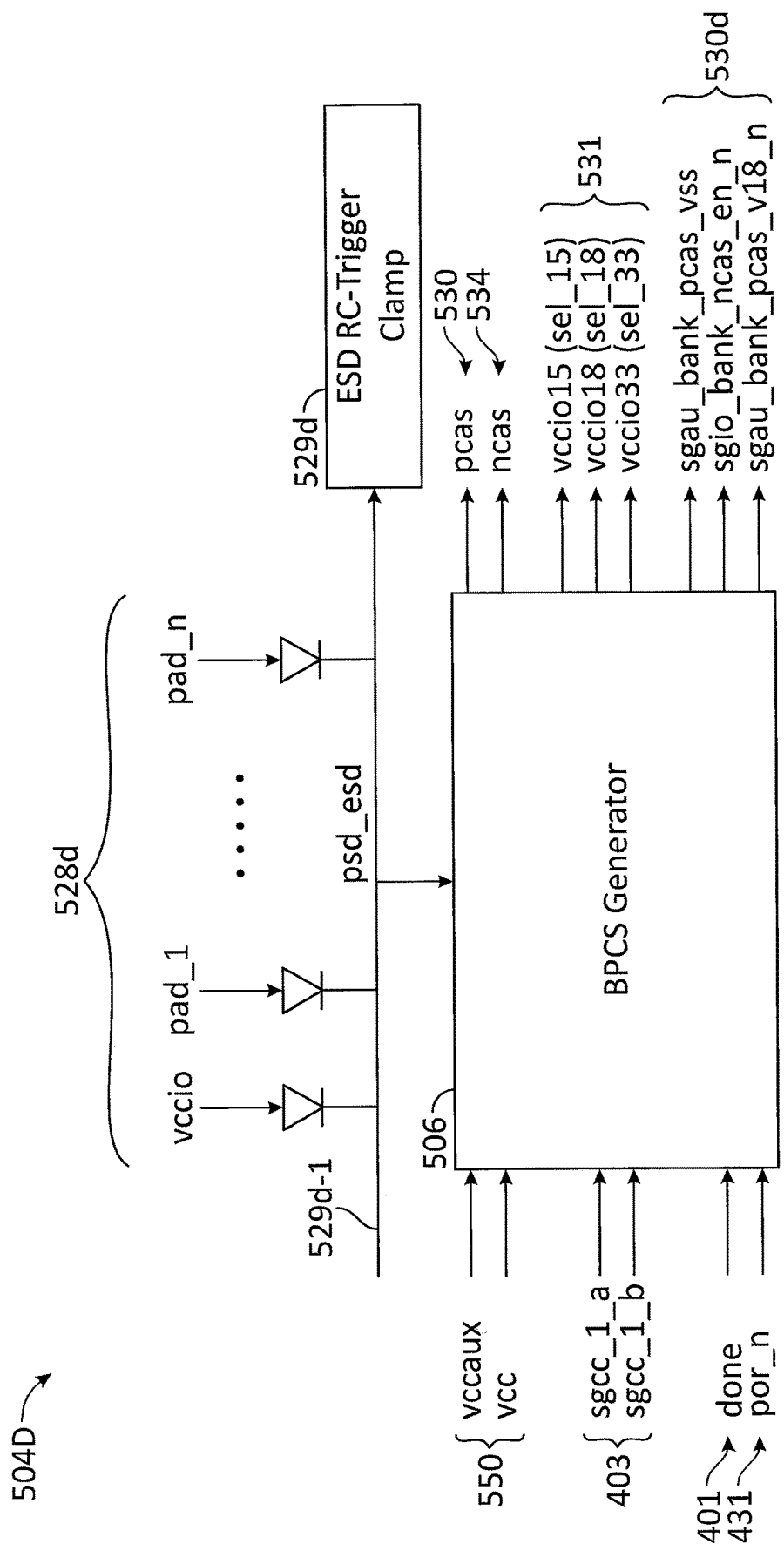

FIG. 5D illustrates a block diagram of a programmable I/O interface 504D with additional detail as to the various control signals that may be received and/or generated by embodiments of BPCD generator 506. For example, as shown in FIG. 5D, BPCS generator 506 may be configured to receive external supply signals 550, PLD fabric bus control signals 403, PLD configuration load completion signal 401, and/or a power on reset signal (or its inverse) 431 and to generate bus protection control signals pcasc 530 and ncasc 534, as described herein, along with bus supply voltage enable signals 531 and bus protection relay signals 530d, as shown. Also shown in FIG. 5D are bus interface signals 528d (e.g., which may include VCCIO) coupled through to BPCS generator 506 and configured to generate an aggregate bus interface electrostatic discharge trigger 529d-1, which may be used by electrostatic discharge clamp 529d to protect BPCS generator 506 and/or other elements of PLD 410 when I/O bus interface is coupled, decoupled, and/or powered on or off.

Figure 6A:
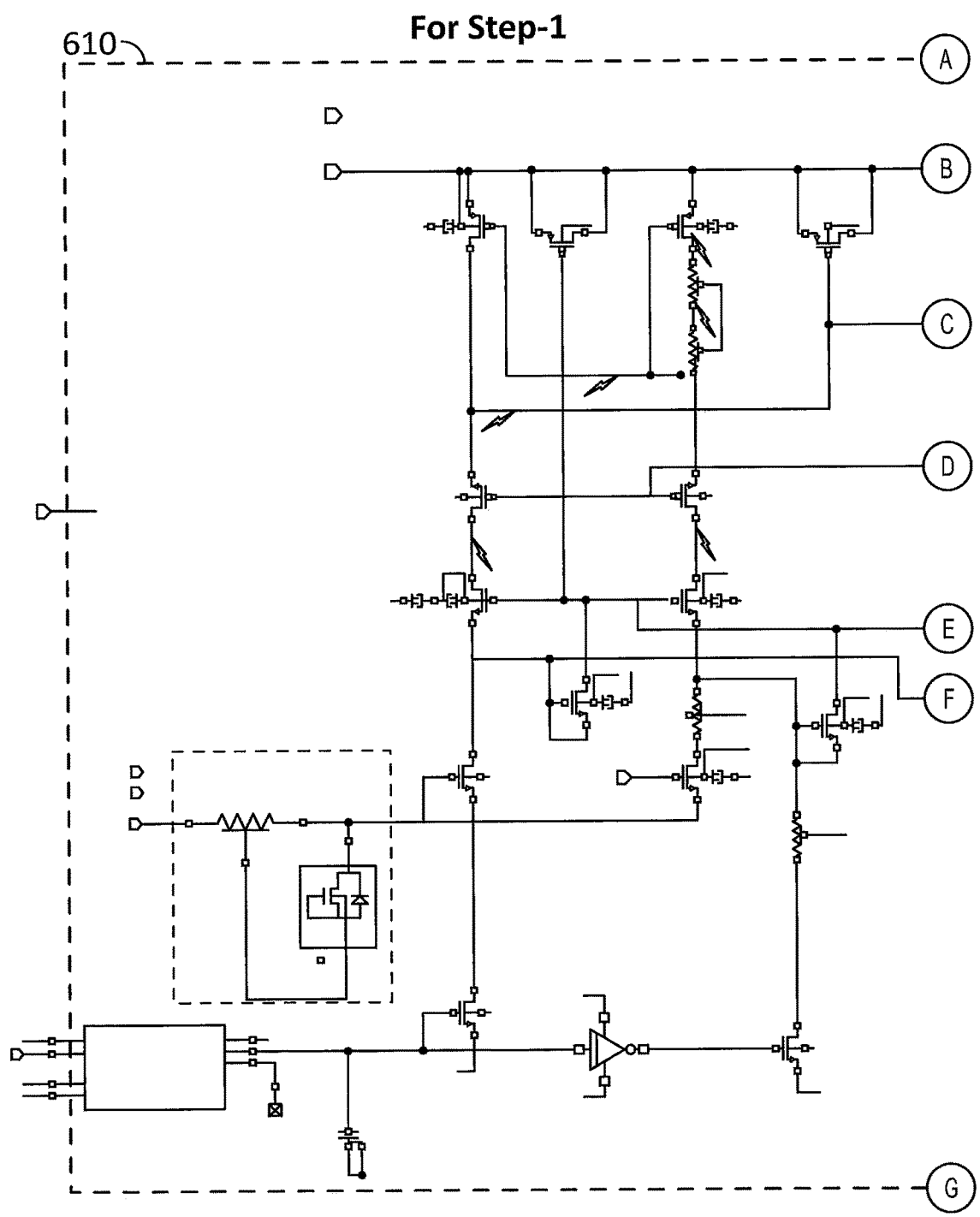
FIGS. 6A-F illustrate circuit diagrams of various bus protection control signal generators in accordance with embodiments of the disclosure.
Figure 6A:
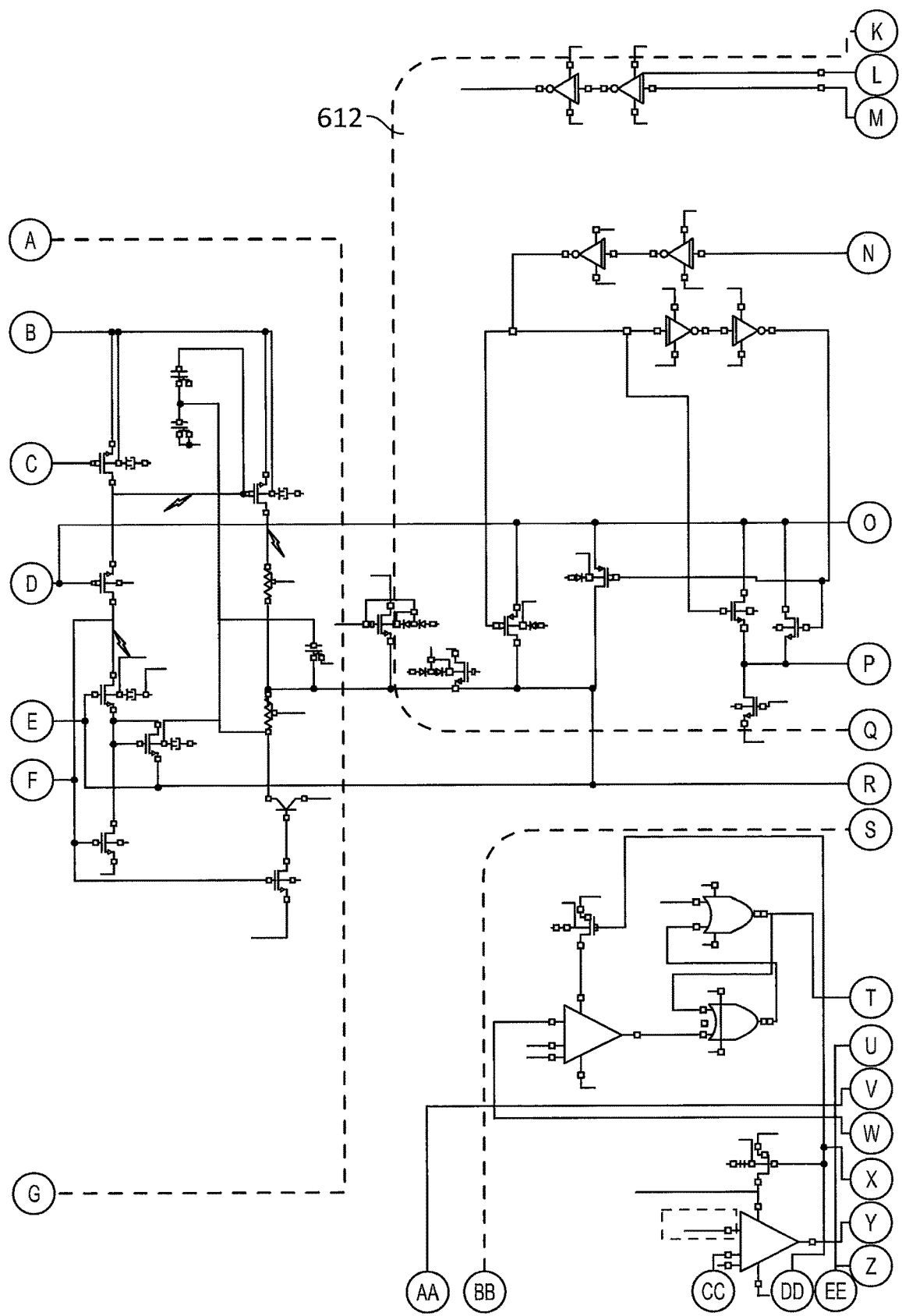
Figure 6A:
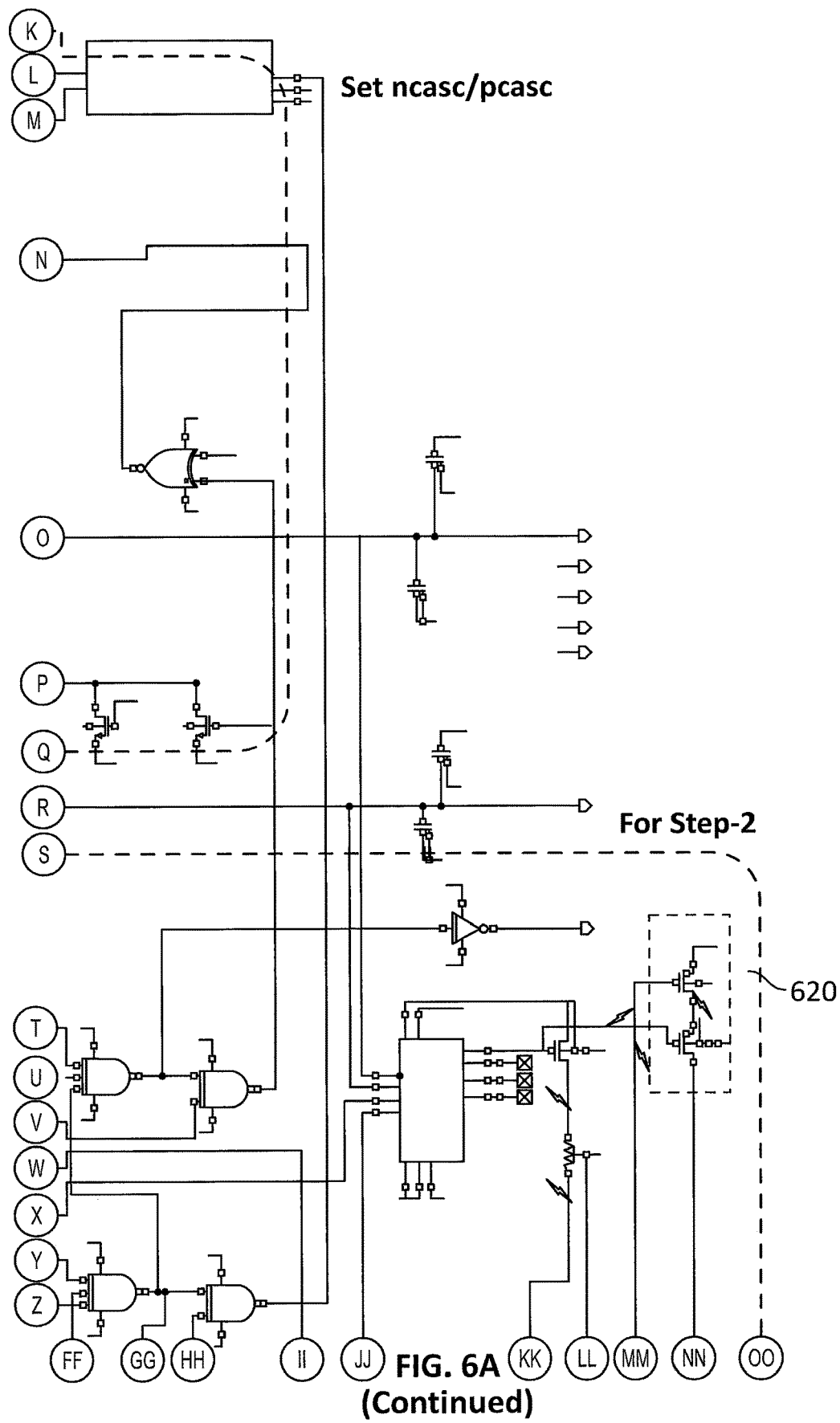
Figure 6A:
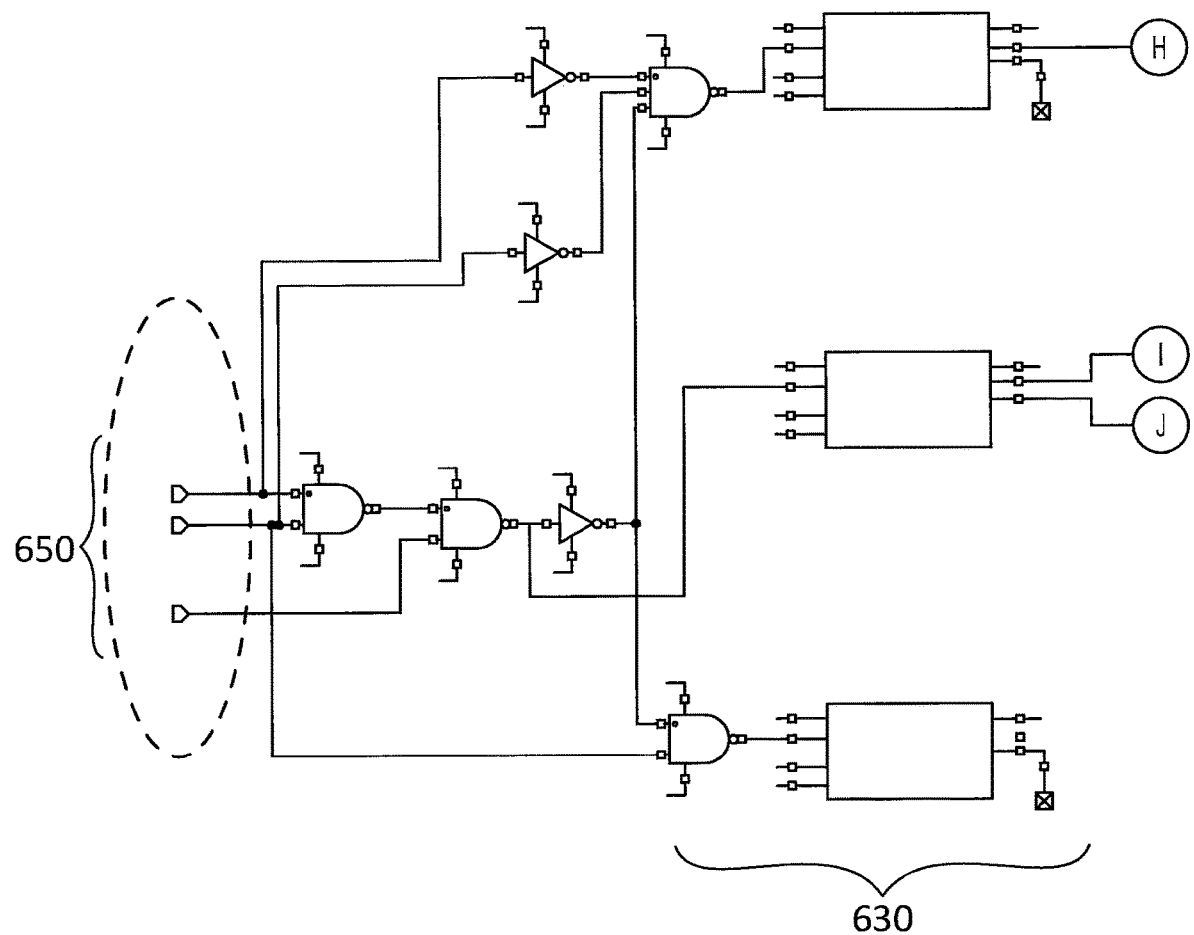

FIGS. 6A-F illustrate circuit diagrams of various bus protection control signal generators 506 in accordance with embodiments of the disclosure. For example, FIG. 6A illustrates bus protection control signal generator 506A including portion 610 configured to generate bus protection control signals prior to user device 430 completing a power ramp of at least external supply signals 550 identified in FIGS. 5A-D. For example, such control signals may be refereed to generally as default or initial or power ramping bus protection control signals, as described herein, and may be configured to control an associated bus protection circuit arrangement (e.g., as shown in FIGS. 5A-D) to place an associated programmable I/O (e.g., programmable I/O 404 of PLD 410) into a default or initial or safed or power ramping mode, for example, where the associated bus protection circuit arrangement is configured to accept and/or operate under any possible bus supply voltage without risking damage to the associated programmable I/O interface. For example, such default or initial or safed or power ramping mode may be a mode able to accept and/or operate under a 3.3v bus supply voltage, thereby protecting the programmable I/O interface from all possible VCCIOs. In particular embodiments, such default or initial or power ramping bus protection control signals may be set to one half the supplied VCCIO using a resistor divider circuit arrangement disposed within portion 610.

Similarly, bus protection control signal generator 506A is shown in FIG. 6A as including portions 612 and 620 configured to generate bus protection control signals after user device 430 has completed a power ramp of at least external supply signals 550 identified in FIGS. 5A-D, and prior to PLD 410 completing loading of a PLD configuration into PLD fabric 400, as shown in FIG. 4. For example, such control signals may be refereed to generally as intermediate or PLD configuration loading bus protection control signals, as described herein, and may be configured to control an associated bus protection circuit arrangement (e.g., as shown in FIGS. 5A-D) to place an associated programmable I/O (e.g., programmable I/O 404 of PLD 410) into an intermediate or PLD configuration loading mode, for example, where the associated bus protection circuit arrangement is configured to accept and/or operate under a detected fully ramped bus supply voltage without risking damage to the associated programmable I/O interface.

In some embodiments, bus protection control signal generator 506A may include portions 612, 620, and 630 configured to generate bus protection control signals after user device 430 has completed a power ramp of at least external supply signals 550 and after a PLD configuration has been loaded into PLD fabric 400. For example, such control signals may be refereed to generally as operational or PLD configured bus protection control signals, as described herein, and may be configured to control an associated bus protection circuit arrangement (e.g., as shown in FIGS. 5A-D) to place an associated programmable I/O (e.g., programmable I/O 404 of PLD 410) into an operating or PLD configured mode, for example, where the associated bus protection circuit arrangement is configured to accept and/or operate under a detected fully ramped bus supply voltage and/or a PLD fabric selected bias supply voltage without risking damage to the associated programmable I/O interface. For example, PLD fabric 400 may be configured to place bus protection circuit arrangement 504A of FIG. 5A into a 1.8v VCCIO mode, even though user device 430 is not providing a VCCIO to the associated programmable I/O, because PLD fabric 400 has been configured to expect such VCCIO over the associated programmable I/O at some point during the operation of PLD 410 and/or user device 430.

Figure 6B:
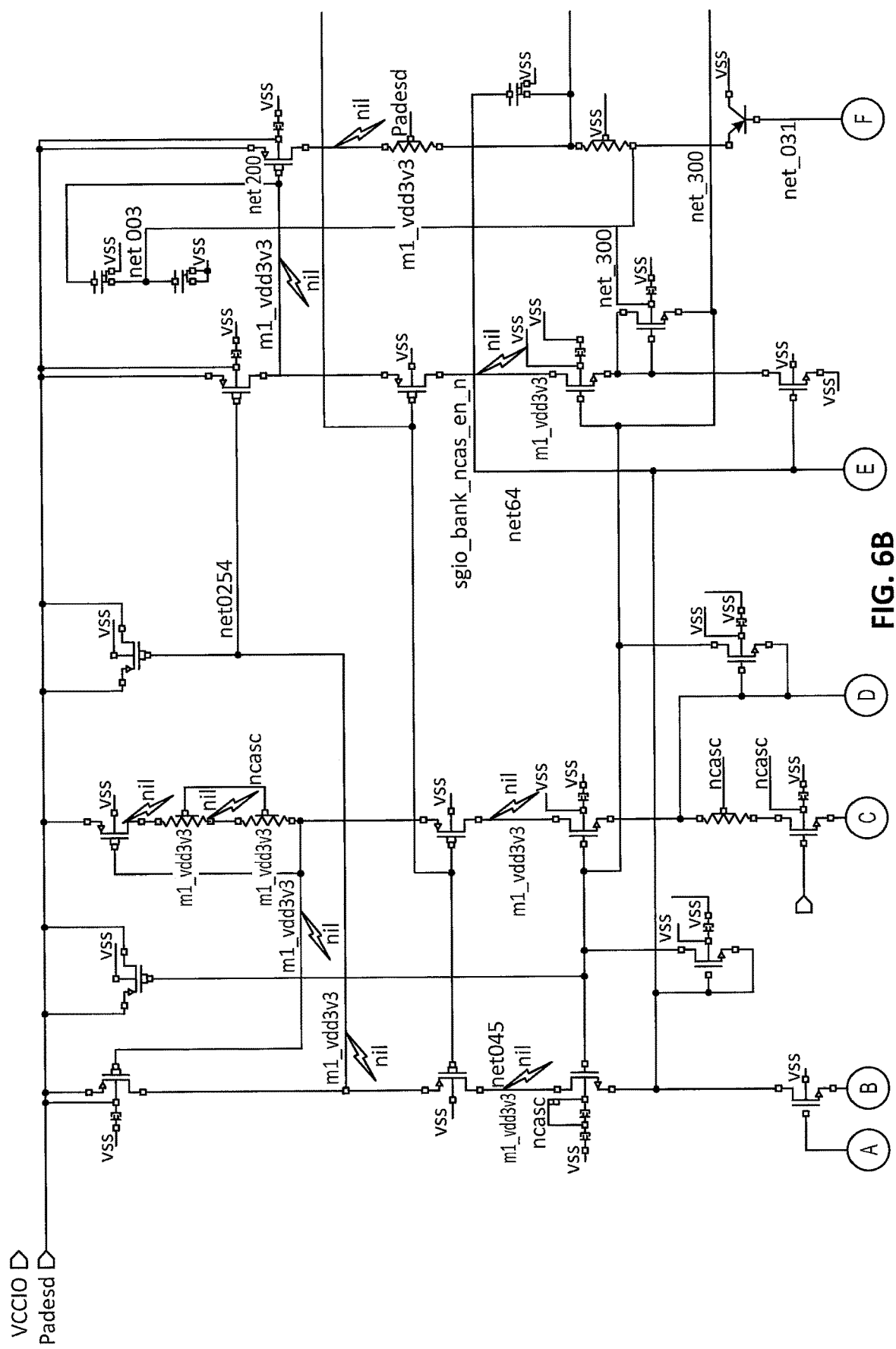
Figure 6B:
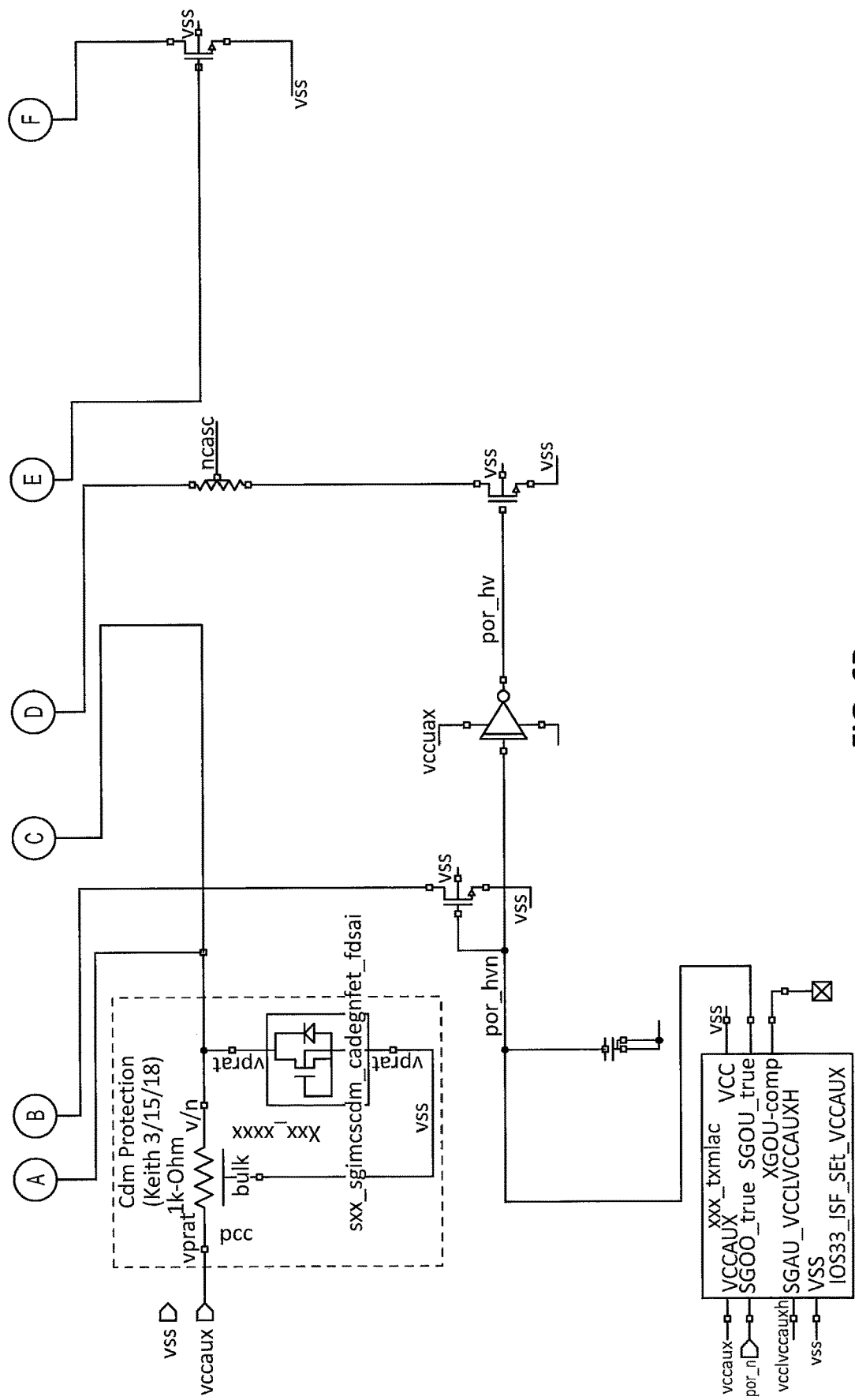
Figure 6C:
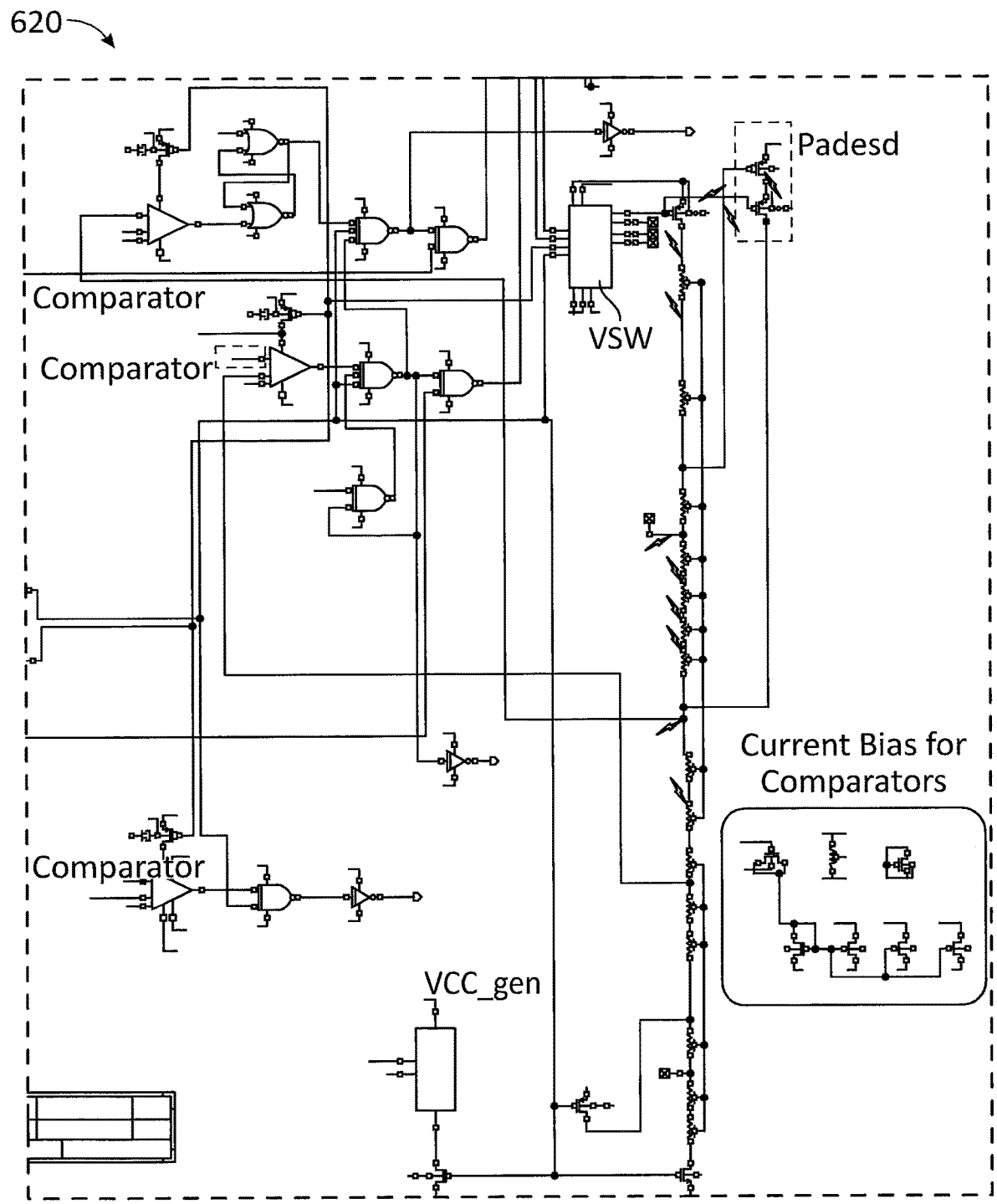
Figure 6D:
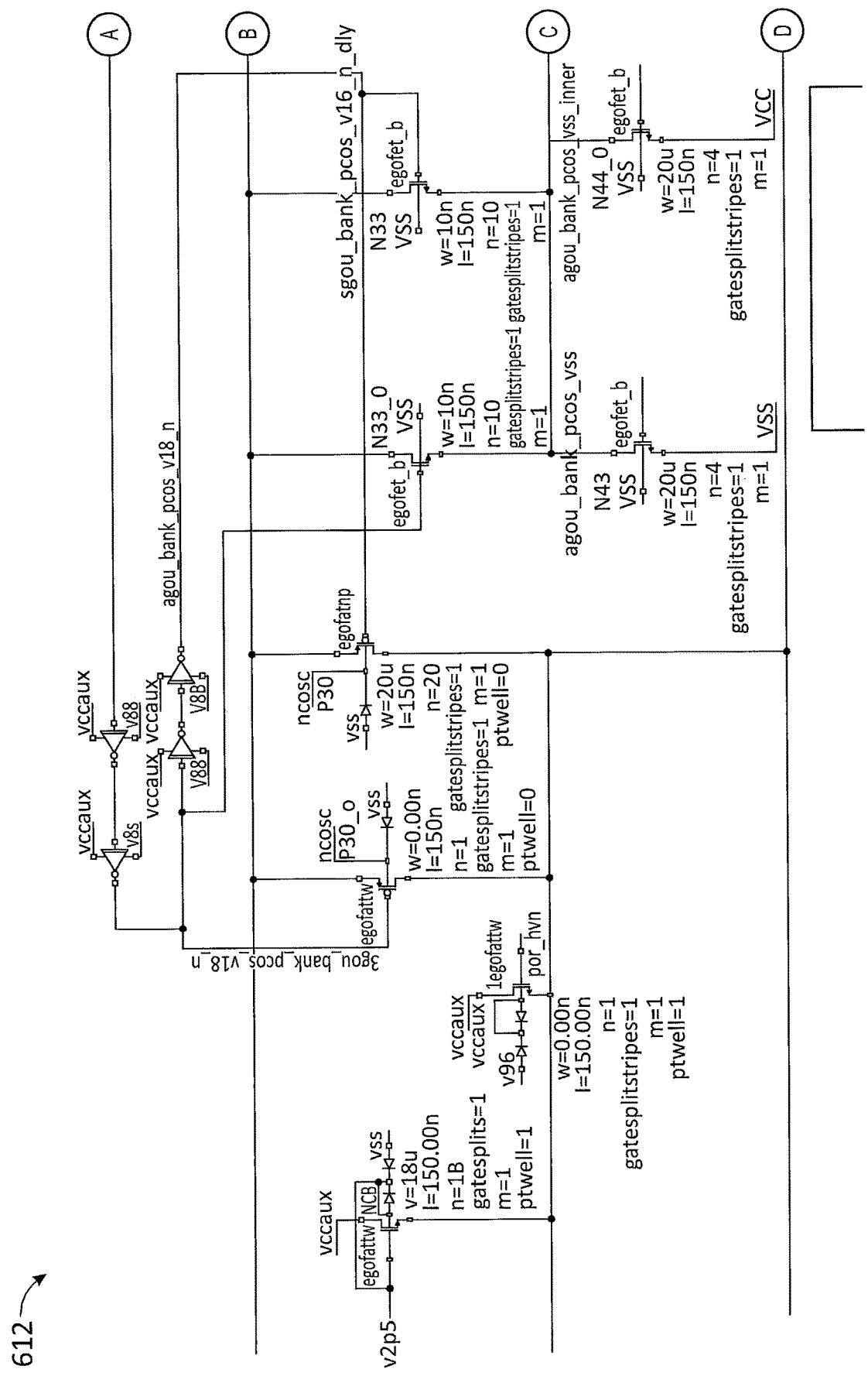
Figure 6D:
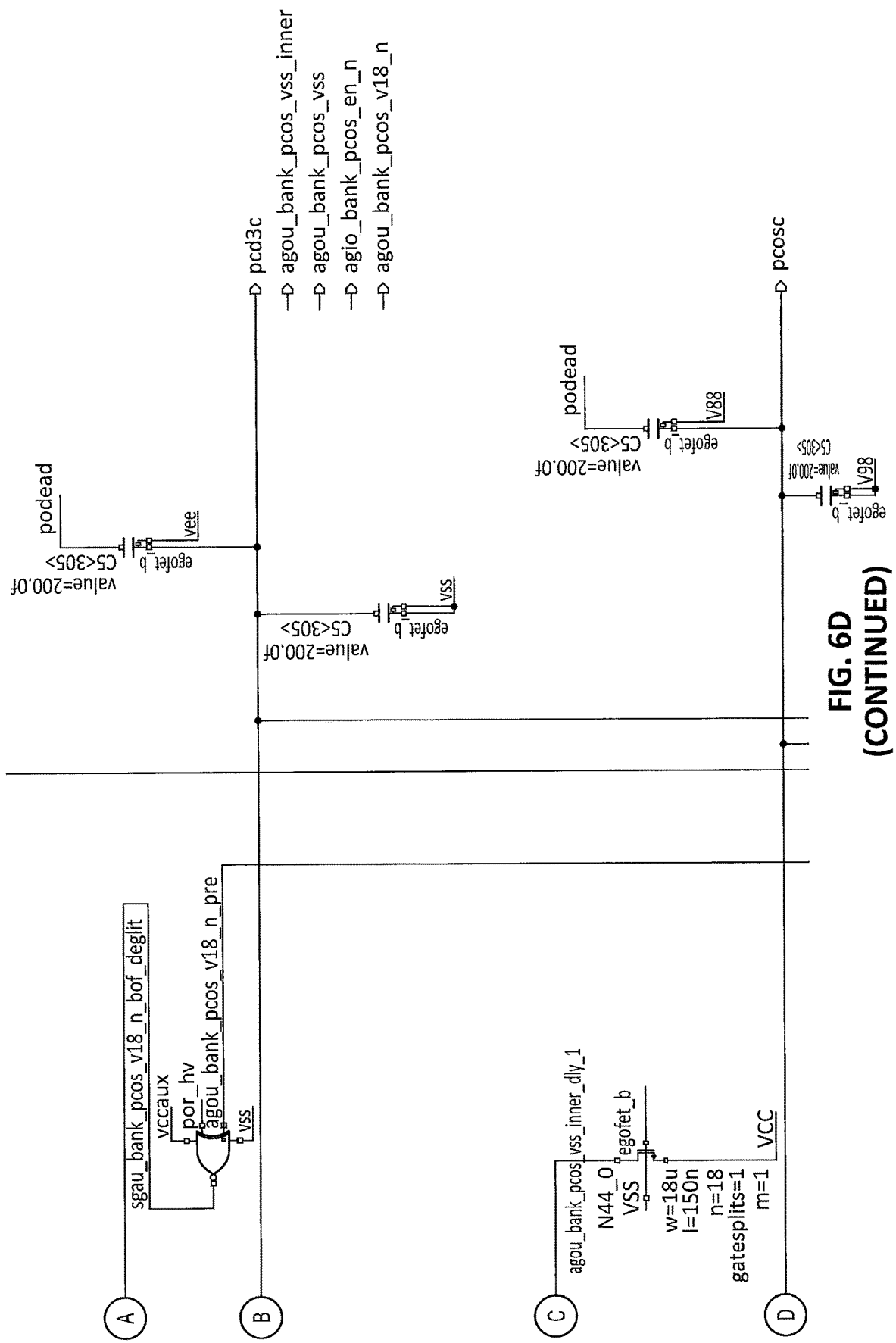
Figure 6E:
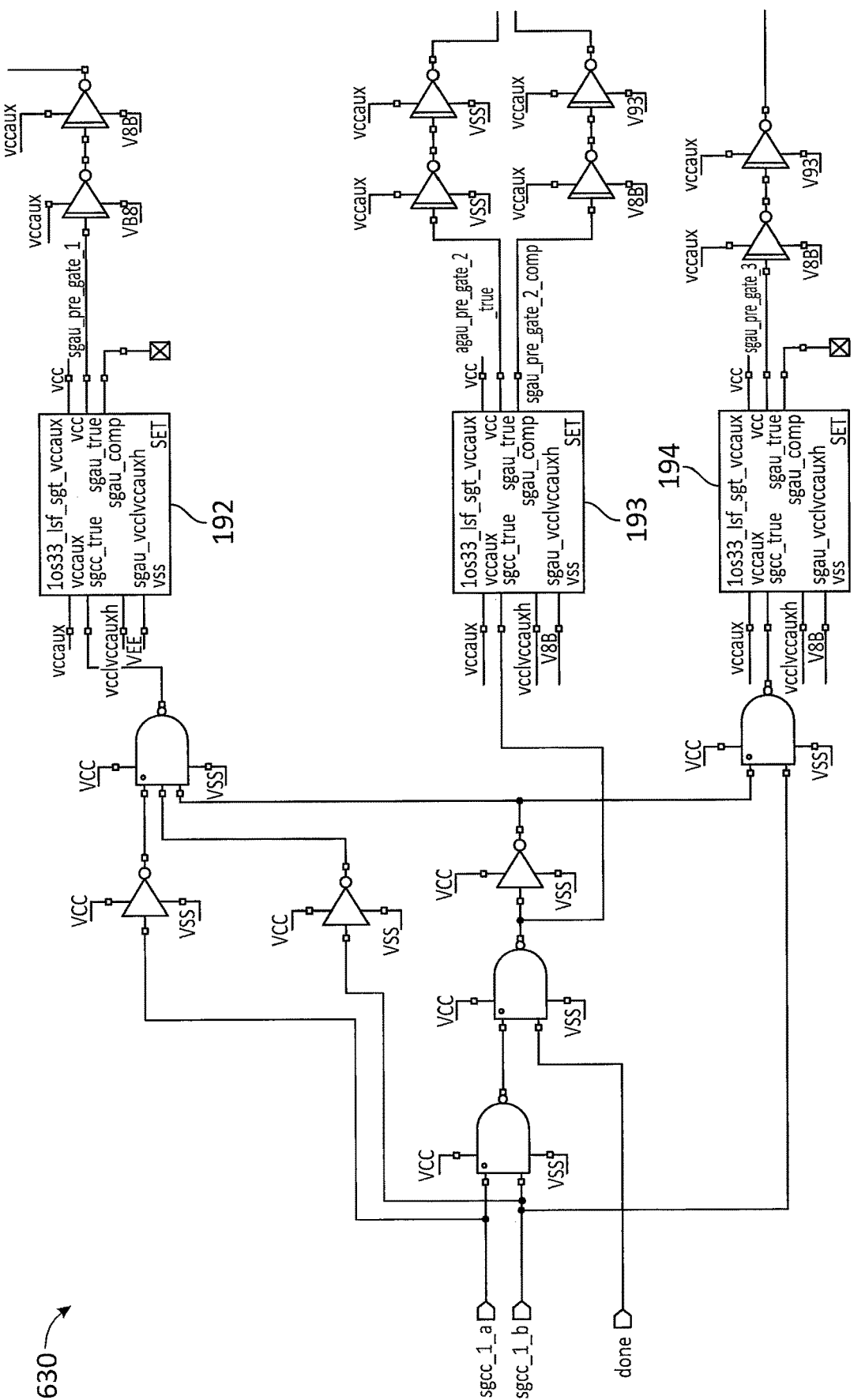

The remaining FIGS. 6B-6E illustrate details of portions 610, 612, 620, and 630. For example, FIG. 6B illustrates a circuit diagram substantially implementing portion 610 of bus protection control signal generator 506A with various transistors, resistors, capacitors, logic gates, integrated circuits (ICs), circuit traces, and/or other circuit elements, as shown. FIG. 6C illustrates a circuit diagram substantially implementing portion 620 of bus protection control signal generator 506A with various transistors, resistors, capacitors, logic gates, integrated circuits (ICs), circuit traces, and/or other circuit elements, as shown. FIG. 6D illustrates a circuit diagram substantially implementing portion 612 of bus protection control signal generator 506A with various transistors, resistors, capacitors, logic gates, integrated circuits (ICs), circuit traces, and/or other circuit elements, as shown. FIG. 6E illustrates a circuit diagram substantially implementing portion 630 of bus protection control signal generator 506A with various transistors, resistors, capacitors, logic gates, integrated circuits (ICs), circuit traces, and/or other circuit elements, as shown.

Figure 6F:
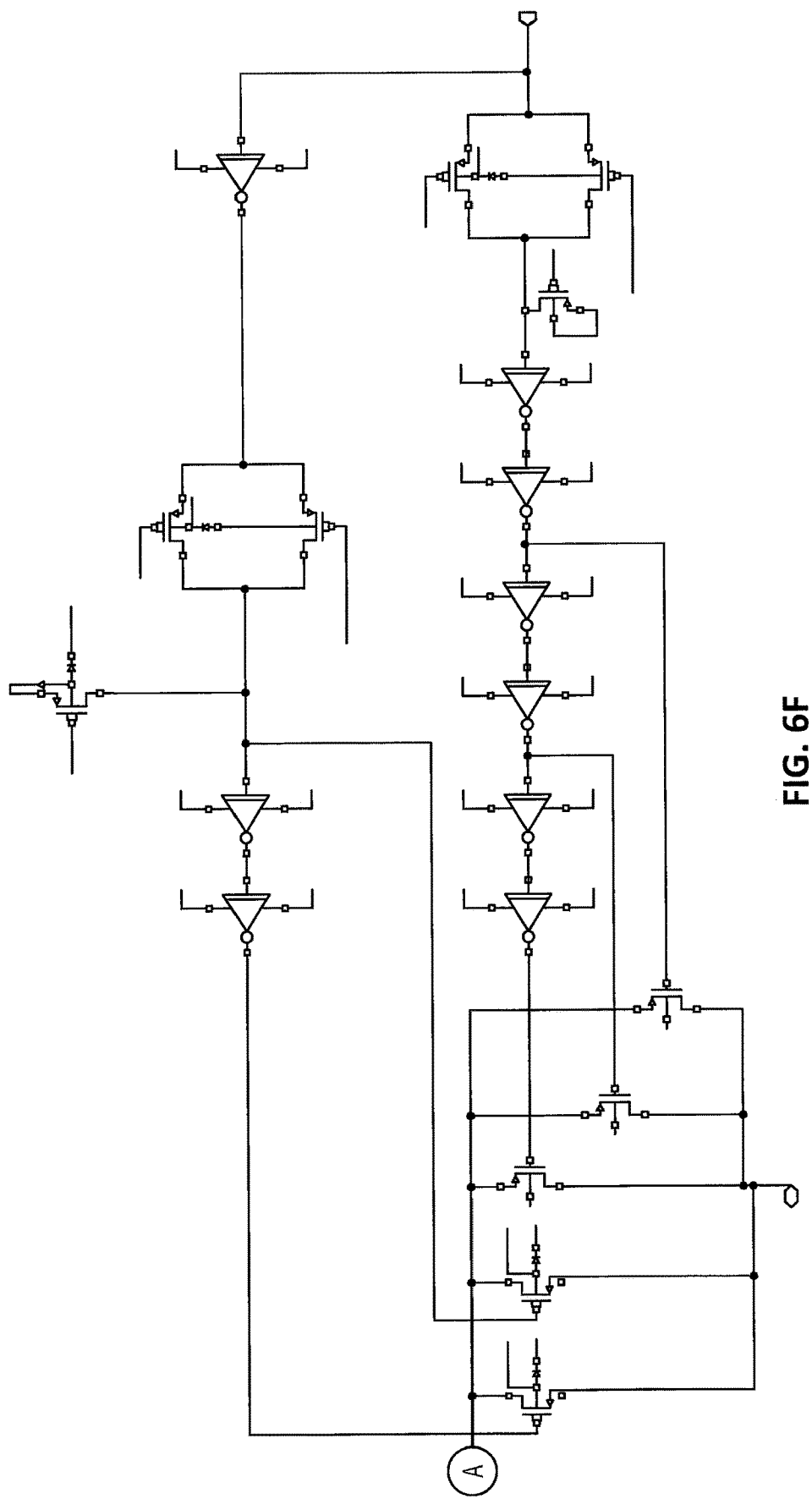

In general, FIGS. 6A-F illustrate circuitry that may be used to implement embodiments of common block BPCS generator 506 and/or local BPCS generators 507 of FIG. 5C. In some embodiments, local BPCS generators 507 may be implemented with fewer circuit elements so as reduce utilization of PLD resources, for example, as described herein. FIG. 6F illustrates a circuit diagram of a reduced-resource embodiment of local BPCS generators 507 shown in the embodiment depicted by FIG. 5C.

Figure 7A:
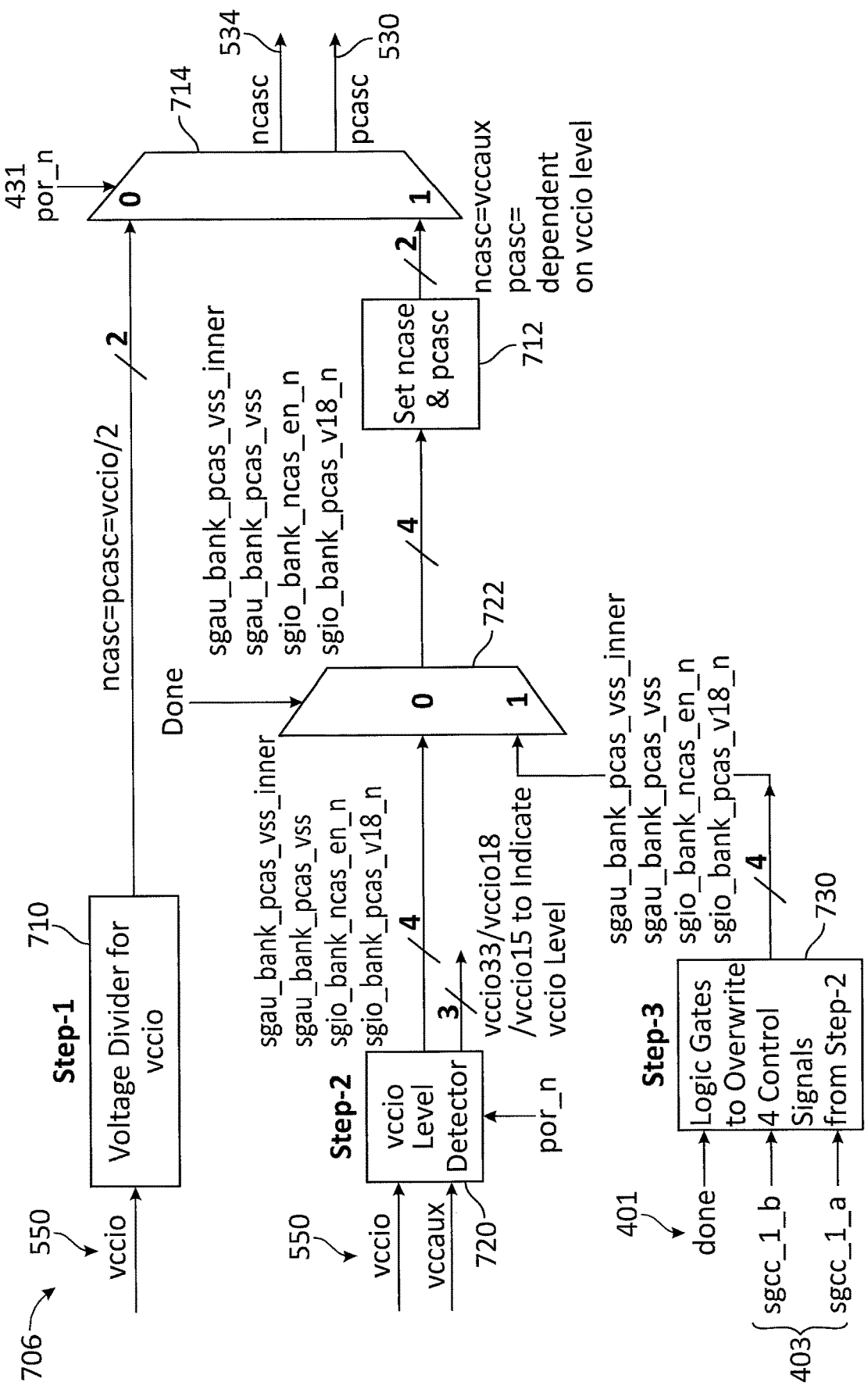
FIG. 7A illustrates a block diagram of a bus protection control signal generator in accordance with an embodiment of the disclosure.

FIG. 7A illustrates a block diagram of bus protection control signal generator 706 in accordance with an embodiment of the disclosure. In various embodiments, bus protection control signal generator 706 may be implemented similarly to bus protection control signal generators 506 and/or 606 of FIGS. 5A-6F, as described herein. In the embodiment shown in FIG. 7A, bus protection control signal generator 706 shows the general operation of a bus protection control signal generator implemented according to embodiments described herein.

In general, bus protection control signal generators described herein may be operated in accordance with three sequential steps or modes of operation: a power ramping step or mode, a PLD configuration loading step or mode, and an operational step or mode. In the power ramping step, or before power on reset signal 431 transitions, user device 430 ramps each of external supply signals 550 (e.g., core voltage VCC, VCCAUX, I/O bus supply voltage VCCIO) up to their operating level. User device 430 may ramp them in any order, and the order may change from power on to power on, and so operational flexibility (e.g., power ramping levels and sequence) of bus protection control signal generator 706 during the power ramping step is desirable. Typically, all external supply signals 550 are provided or dictated by user device 430. PLD 410 may require a specific core voltage VCC (e.g., 1 v+/−5%) and a specific VCCAUX (e.g., 1.8v+/−5%) as part of its operational specification, but VCCIO can vary by user device, programmable I/O, and/or port/pad of programmable I/O, and each may be ramped to its respective operating level in any order (and, for multiple VCCIOs, each VCCIO may be ramped in any order). A power ramp completion detection module (e.g., other IC modules 406) may be configured to monitor all such external supply signals 550, along with other control signals provided by user device 430, and to generate power on reset signal 431 once all such power ramping is complete, either on a per programmable I/O or bus basis, or across the entirety of PLD 410.

In order to provide the desired flexibility during the power ramping step 1, an assumption can be made as to the maximum extent of any VCCIO, and bus protection control signal generator 706 may be configured to generate a bus protection control signal for an associated bus protection circuit arrangement to ensure all transistor voltages generated by any VCCIO up to the maximum extent (e.g., typically 3.3v) is less than the desired operational voltage for those transistors (e.g., typically 1.8v+/−10%). In embodiments where the associated bus protection circuit arrangement is implemented as a cascode transistor arrangement, such as that shown in FIG. 5A, bus protection control signal generator 706 may be implemented with a voltage divider 710 and/or a multiplexor 714 configured to generate bus protection control signals setting pcasc 530 and ncasc 534 to approximately VCCIO/2, which protects all transistors of bus protection circuit arrangement 538 against damage by VCCIOs up to the max extent expected (e.g., 3.3v) while generally providing for data signaling transmission/reception during the power ramping step 1.

In the PLD configuration loading step, or after power on reset signal 431 transitions but before PLD configuration load completion signal 401 transitions, PLD fabric 400 is not operating under a loaded configuration, but all applicable external supply signals 550 are fully ramped to their operating level. In various embodiments, bus protection control signal generator 706 may be configured to compare VCCIO and VCCAUX, determine the fully ramped VCCIO level based on that detection, reliably, and to determine and/or generate appropriate bus protection control signals and/or adjustments to such signals (e.g., bus protection control signals setting pcasc 530 and ncasc 534) dynamically, so as to maximize data signaling reliability while ensuring all transistor voltages are below an associated acceptable operational voltage drop, as described herein. Information regarding VCCIO levels may also be useful for other IPs (e.g. I2C/I3C driver strength setting, LVCMOS input buffer selection from wide range of inputs, and/or other hard or soft IPs associated with PLD 410).

In embodiments where the associated bus protection circuit arrangement is implemented as a cascode transistor arrangement, such as that shown in FIG. 5A, bus protection control signal generator 706 may be implemented with a bus supply voltage level detector 720, multiplexor 722, a pcasc/ncasc level generator 712, and/or multiplexor 714 configured to generate bus protection control signals setting pcasc 530 and ncasc 534 to appropriate levels to protect all transistors of bus protection circuit arrangement 538 against damage. Below is an example truth table of various control signals associated with various detected bus supply voltages and operation of bus supply voltage level detector 720 and pcasc/ncasc level generator 712.

TABLE 1

| Input pin vccio (v) | Output pin vccio33 | Output pin vccio18 | Output pin vccio15 | Output pin pacsc | Output pin ncasc |
|---|---|---|---|---|---|
| 3.3 | vccaux | 0 | 0 | vccaux | vccaux |
| 2.5 | 0 | 0 | 0 | vcc | vccaux |
| 1.8 | 0 | vccaux | 0 | 0 | vccaux |
| 1.5 & 1.2 | 0 | vccaux | Vccaux | 0 | vccaux |

In the operational step, or after power on reset signal 431 transitions and after PLD configuration load completion signal 401 transitions, PLD fabric 400 is operating under a loaded configuration, and all applicable external supply signals 550 are fully ramped to their operating level. In various embodiments, bus protection control signal generator 706 may be configured to receive PLD fabric bus control signals 403, thereby allowing PLD fabric 400 to control bus protection control signal generator 706 to generate appropriate bus protection control signals and/or adjustments to such signals, so as to maximize data signaling reliability while ensuring all transistor voltages are below an associated acceptable operational voltage drop, as described herein. In some embodiments, such control can help resolve granularity limitations in detecting between 1.2v and 1.5v VCCIOs (e.g., in step 2, bus protection control signal generator 706 may not differentiate between 1.2v and 1.5v VCCIOs, whereas in step 3, known VCCIOs may be set granularly based on known expected VCCIOs).

In embodiments where the associated bus protection circuit arrangement is implemented as a cascode transistor arrangement, such as that shown in FIG. 5A, bus protection control signal generator 706 may be implemented with a PLD fabric override 730, multiplexor 722, pcasc/ncasc level generator 712, and/or multiplexor 714 configured to generate bus protection control signals setting pcasc 530 and ncasc 534 to desired levels selected by PLD fabric 400, which may be used to protect all transistors of bus protection circuit arrangement 538 against damage. Below is an example truth table of various control signals associated with various detected bus supply voltages and operation of PLD fabric override 730 and pcasc/ncasc level generator 712.

TABLE 2

| Input pin vccio (v) | Input pin sgcc_1_b | Input pin sgcc_1_a | Output pin vccio33 | Output pin vccio18 | Output pin vccio15 | Output pin pacsc | Output pin ncasc |
|---|---|---|---|---|---|---|---|
| 3.3 | 0 | 0 | 0 | 0 | 0 | vccaux | vccaux |
| 2.5 | 0 | vcc | 0 | 0 | 0 | vcc | vccaux |
| 1.8 | vcc | 0 | 0 | 0 | 0 | 0 | vccaux |
| 1.5 & 1.2 | vcc | 0 | 0 | 0 | 0 | 0 | vccaux |

Figure 7B:
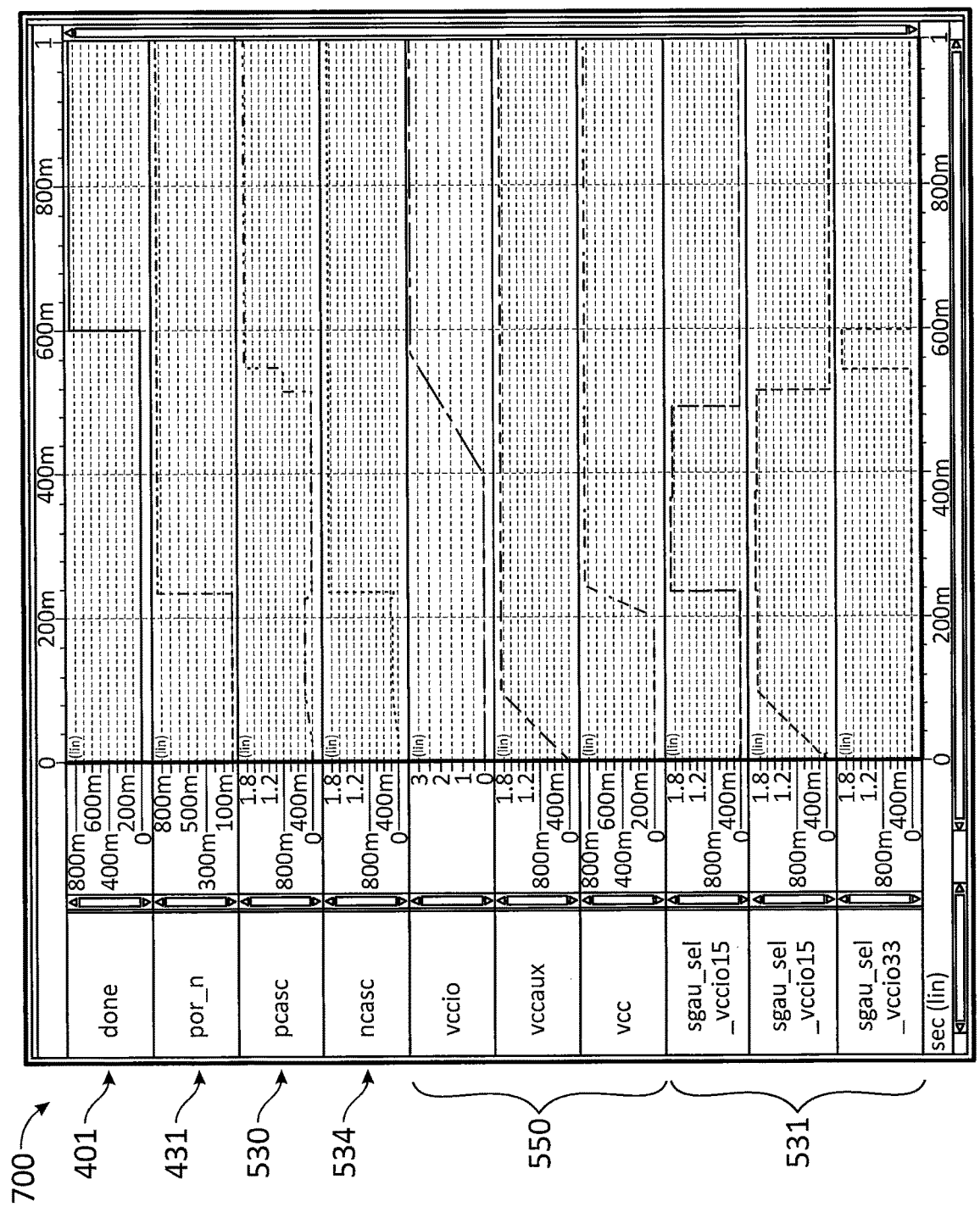
FIG. 7B illustrates a typical power ramp timing graph for a PLD including a bus protection control signal generator in accordance with an embodiment of the disclosure.

FIG. 7B illustrates a typical power ramp timing graph 700 for PLD 410 including bus protection control signal generator 706 coupled to/within user device 430 in accordance with an embodiment of the disclosure. As shown in FIG. 7B, power ramp timing graph 700 shows time evolutions of load completion signal 401, power on reset signal (or its inverse) 431, bus protection control signals pcasc 530 and ncasc 534, external supply signals 550, and bus supply voltage enable signals 531.

Figure 8:
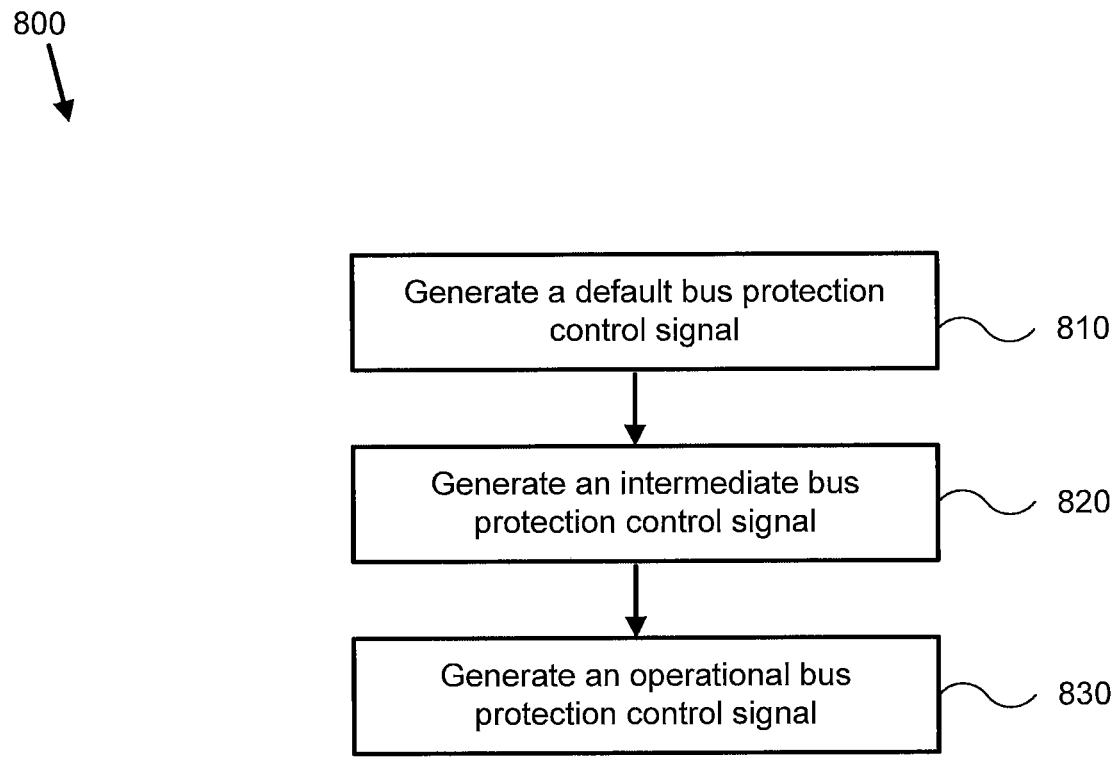
FIG. 8 illustrates an I/O buss protection process in accordance with an embodiment of the disclosure.

FIG. 8 illustrates an I/O buss protection process 800 in accordance with an embodiment of the disclosure. In some embodiments, the operations of FIG. 8 may be implemented as software instructions executed by one or more logic devices associated with corresponding electronic devices, modules, and/or structures depicted in FIGS. 1-7B. More generally, the operations of FIG. 8 may be implemented with any combination of software instructions and/or electronic hardware (e.g., inductors, capacitors, amplifiers, actuators, or other analog and/or digital components). It should be appreciated that any step, sub-step, sub-process, or block of process 800 may be performed in an order or arrangement different from the embodiments illustrated by FIG. 8. For example, in other embodiments, one or more blocks may be omitted from process 800, and other blocks may be included. Furthermore, block inputs, block outputs, various sensor signals, sensor information, calibration parameters, and/or other operational parameters may be stored to one or more memories prior to moving to a following portion of process 800. Although process 800 is described with reference to systems, devices, and elements of FIGS. 1-5, process 800 may be performed by other systems, devices, and elements, and including a different selection of electronic systems, devices, elements, assemblies, and/or arrangements. At the initiation of process 800, various system parameters may be populated by prior execution of a process similar to process 800, for example, or may be initialized to zero and/or one or more values corresponding to typical, stored, and/or learned values derived from past operation of process 800, as described herein.

In block 810, a logic device generates a default bus protection control signal. For example, bus protection control signal generator 506 may be configured to generate a default or initial or safed or power ramping bus protection control signal (e.g., pcasc 530 and/or ncasc 534) for PLD 410 of user device 430.

In block 820, a logic device generates an intermediate bus protection control signal. For example, bus protection control signal generator 506 may be configured to generate an intermediate or PLD configuration loading bus protection control signal (e.g., pcasc 530 and/or ncasc 534) for PLD 410 of user device 430. In various embodiments, bus protection control signal generator 506 may be configured to detect completion of a power ramp performed by user device 430 prior to generating the intermediate or PLD configuration loading bus protection control signal, for example, such that the generating the intermediate or PLD configuration loading bus protection control signal is triggered by a control signal/comparator output indicating completion of such power ramp.

In block 830, a logic device generates an operational bus protection control signal. For example, bus protection control signal generator 506 may be configured to generate an operating or PLD configured bus protection control signal (e.g., pcasc 530 and/or ncasc 534) for PLD 410 of user device 430. In various embodiments, bus protection control signal generator 506 may be configured to detect completion of loading a PLD configuration into PLD fabric 400 prior to generating the operating or PLD configured bus protection control signal, for example, such that the generating the operating or PLD configured bus protection control signal is triggered by a control signal indicating completion of loading a PLD configuration into PLD fabric 400.

Thus, by employing the systems and methods described herein, embodiments of the present disclosure are able to provide flexible and reliable I/O bus protection for a PLD during all common modes of operation and all possible power ramping levels and sequences. Moreover, embodiments are able to do so while providing sufficient transistor voltages (e.g., Vgs) for meeting typical driver strength specifications.

Where applicable, various embodiments provided by the present disclosure can be implemented using hardware, software, or combinations of hardware and software. Also, where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

What is claimed is:
1. A programmable logic device (PLD), comprising:
a programmable input/output (I/O) interface configured to interface with a user device over an external bus coupled to the PLD;
a bus protection circuit arrangement integrated with the programmable I/O interface and configured to provide I/O bus supply voltage protection for the programmable I/O interface; and
a bus protection control signal generator coupled to the programmable I/O interface and/or the bus protection circuit arrangement, wherein the bus protection control signal generator is configured to:
generate a default bus protection control signal for the bus protection circuit arrangement of the PLD prior to completion of a power ramp performed by the user device;
generate an intermediate bus protection control signal for the PLD prior to completion of loading a PLD configuration into a PLD fabric of the PLD; and
generate an operational bus protection control signal for the PLD.
2. The PLD of claim 1, wherein:
the bus protection circuit arrangement comprises a cascode transistor arrangement disposed between a bus supply voltage and a ground for the programmable I/O interface.

3. The PLD of claim 2, wherein:
the cascode transistor arrangement comprises a PMOS protection transistor and an NMOS protection transistor configured to receive the default, intermediate, and operational bus protection control signals generated by the bus protection control signal generator.

4. The PLD of claim 2, wherein the cascode transistor arrangement comprises:
a PMOS signaling transistor coupled between the bus supply voltage and a PMOS protection transistor;
an NMOS protection transistor, wherein the PMOS protection transistor is coupled between the PMOS signaling transistor and the NMOS protection transistor;
an NMOS signaling transistor, wherein the NMOS protection transistor is coupled between the PMOS protection transistor and the NMOS signaling transistor, and wherein the NMOS signaling transistor is coupled between the NMOS protection transistor and the ground for the programmable I/O interface.

5. The PLD of claim 2, wherein:
the cascode transistor arrangement comprises an enable transistor configured to receive an enable control signal generated by a PLD fabric of the PLD to enable and/or disable a particular I/O bus supply voltage for the programmable I/O interface.

6. The PLD of claim 1, wherein:
the bus protection control signal generator comprises a voltage divider and/or a multiplexor configured to generate the default bus protection control signal; and
the default bus protection control signal is set to approximately half a bus supply voltage.

7. The PLD of claim 1, wherein:
the bus protection control signal generator comprises a bus supply voltage level detector, a first multiplexor, a pcasc/ncasc level generator, and/or a second multiplexor configured to generate the intermediate bus protection control signal; and
the intermediate bus protection control signal is set to a value based, at least in part, on a detected bus supply voltage, to protect bus protection circuit arrangement against damage caused by the bus supply voltage.

8. The PLD of claim 1, wherein:
the bus protection control signal generator comprises a PLD fabric override, a first multiplexor, a pcasc/ncasc level generator, and/or a second multiplexor configured to generate the operational bus protection control signal; and
the operational bus protection control signal is set to a value based, at least in part, on a detected bus supply voltage and/or a desired level selection by a PLD fabric of the PLD, to protect the bus protection circuit arrangement against damage caused by the bus supply voltage.

9. The PLD of claim 1, wherein:
the bus protection control signal generator comprises a common block bus protection control signal generator coupled though an array of local block bus protection control signal generators each configured to apply the default, intermediate, and/or operational bus protection control signals generated by the common block bus protection control signal generator to respective I/O buses of the programmable I/O interface;
the bus protection circuit arrangement integrated with the programmable I/O interface comprises the array of local block bus protection control signal generators;
the common block bus protection control signal generator comprises a bus supply voltage level detector, at least one multiplexor, and/or a pcasc/ncasc level generator configured to generate and provide the default, intermediate, and/or operational bus protection control signals to each local block bus protection control signal generator.

10. The PLD of claim 9, wherein:
each local block bus protection control signal generator comprises a cascode transistor arrangement disposed between a bus supply voltage and a ground for the programmable I/O interface.

11. A method comprising:
generating a default bus protection control signal for a programmable logic device (PLD) prior to completion of a power ramp performed by a user device coupled to the PLD, wherein the default bus protection control signal is configured to control a bus protection circuit arrangement configured to provide input/output (I/O) bus supply voltage protection for an I/O bus of the PLD;
detecting completion of the power ramp performed by the user device coupled to the PLD;
generating an intermediate bus protection control signal for the PLD prior to completion of loading a PLD configuration into a PLD fabric of the PLD;
detecting completion of loading the PLD configuration into the PLD fabric; and
generating an operational bus protection control signal for the PLD.

12. The method of claim 11, wherein:
the bus protection circuit arrangement comprises a cascode transistor arrangement disposed between a bus supply voltage and a ground for a programmable I/O interface.

13. The method of claim 12, wherein:
the cascode transistor arrangement comprises a PMOS protection transistor and an NMOS protection transistor configured to receive the default, intermediate, and operational bus protection control signals.

14. The method of claim 12, wherein the cascode transistor arrangement comprises:
a PMOS signaling transistor coupled between the bus supply voltage and a PMOS protection transistor;
an NMOS protection transistor, wherein the PMOS protection transistor is coupled between the PMOS signaling transistor and the NMOS protection transistor;
an NMOS signaling transistor, wherein the NMOS protection transistor is coupled between the PMOS protection transistor and the NMOS signaling transistor, and wherein the NMOS signaling transistor is coupled between the NMOS protection transistor and the ground for the programmable I/O interface.

15. The method of claim 12, wherein:
the cascode transistor arrangement comprises an enable transistor configured to receive an enable control signal generated by the PLD fabric of the PLD to enable and/or disable a particular I/O bus supply voltage for the programmable I/O interface.

16. The method of claim 11, wherein:
a bus protection control signal generator comprises a voltage divider and/or a multiplexor configured to generate the default bus protection control signal; and
the default bus protection control signal is set to approximately half a bus supply voltage.

17. The method of claim 11, wherein:
a bus protection control signal generator comprises a bus supply voltage level detector, a first multiplexor, a pcasc/ncasc level generator, and/or a second multiplexor configured to generate the intermediate bus protection control signal; and the intermediate bus protection control signal is set to a value based, at least in part, on a detected bus supply voltage, to protect bus protection circuit arrangement against damage caused by the bus supply voltage.

18. The method of claim 11, wherein:

a bus protection control signal generator comprises a PLD fabric override, a first multiplexor, a pcasc/ncasc level generator, and/or a second multiplexor configured to generate the operational bus protection control signal; and the operational bus protection control signal is set to a value based, at least in part, on a detected bus supply voltage and/or a desired level selection by a PLD fabric of the PLD, to protect the bus protection circuit arrangement against damage caused by the bus supply voltage.

19. The method of claim 11, wherein:

a bus protection control signal generator comprises a common block bus protection control signal generator coupled though an array of local block bus protection control signal generators each configured to apply the default, intermediate, and/or operational bus protection control signals generated by the common block bus protection control signal generator to respective I/O buses of a programmable I/O interface;

the bus protection circuit arrangement integrated with the programmable I/O interface comprises the array of local block bus protection control signal generators;

the common block bus protection control signal generator comprises a bus supply voltage level detector, at least one multiplexor, and/or a pcasc/ncasc level generator configured to generate and provide the default, intermediate, and/or operational bus protection control signals to each local block bus protection control signal generator.

20. The method of claim 19, wherein:

each local block bus protection control signal generator comprises a cascode transistor arrangement disposed between a bus supply voltage and a ground for the programmable I/O interface.

\* \* \* \* \*